United States Patent
Gross et al.

(10) Patent No.: US 10,822,245 B1
(45) Date of Patent: Nov. 3, 2020

(54) METHODS FOR CHARGE-TITRATING PARTICLE ASSEMBLY, AND STRUCTURES PRODUCED THEREFROM

(71) Applicant: HRL Laboratories, LLC, Malibu, CA (US)

(72) Inventors: Adam F. Gross, Santa Monica, CA (US); Shanying Cui, Calabasas, CA (US); John J. Vajo, West Hills, CA (US); Christopher S. Roper, Santa Monica, CA (US)

(73) Assignee: HRL Laboratories, LLC, Malibu, CA (US)

( * ) Notice: Subject to any disclaimer, the term of this patent is extended or adjusted under 35 U.S.C. 154(b) by 205 days.

(21) Appl. No.: 16/155,129

(22) Filed: Oct. 9, 2018

Related U.S. Application Data

(62) Division of application No. 15/241,536, filed on Aug. 19, 2016, now Pat. No. 10,189,718.
(Continued)

(51) Int. Cl.
*B01J 19/00* (2006.01)
*C01G 49/02* (2006.01)
(Continued)

(52) U.S. Cl.
CPC ......... *C01F 17/265* (2020.01); *B01J 19/0046* (2013.01); *C01G 49/0045* (2013.01);
(Continued)

(58) Field of Classification Search
CPC .......... B01J 19/0046; B01J 2219/00331; B01J 2219/00585; B01J 2219/00599;
(Continued)

(56) References Cited

U.S. PATENT DOCUMENTS

| 5,534,461 A | 7/1996 | Kuwajima |
| 5,591,535 A | 1/1997 | Hisano et al. |

(Continued)

OTHER PUBLICATIONS

Barnov et al., "Chemically induced self-assembly of spherical and anisotropic inorganic nanocrystals," J. Mater. Chem. 2011, 21, 16694.
(Continued)

*Primary Examiner* — Jennifer Wecker
(74) *Attorney, Agent, or Firm* — O'Connor & Company

(57) ABSTRACT

Methods to fabricate tightly packed arrays of nanoparticles are disclosed, without relying on organic ligands or a substrate. In some variations, a method of assembling particles into an array comprises dispersing particles in a liquid solution; introducing a triggerable pH-control substance capable of generating an acid or a base; and triggering the pH-control substance to generate an acid or a base within the liquid solution, thereby titrating the pH. During pH titration, the particle-surface charge magnitude is reduced, causing the particles to assemble into a particle array. Other variations provide a device for assembling particles into particle arrays, comprising a droplet-generating microfluidic region; a first-fluid inlet port; a second-fluid inlet port; a reaction microfluidic region, disposed in fluid communication with the droplet-generating microfluidic region; and a trigger source configured to trigger generation of an acid or a base from at least one pH-control substance contained within the reaction microfluidic region.

4 Claims, 20 Drawing Sheets

Related U.S. Application Data

(60) Provisional application No. 62/212,969, filed on Sep. 1, 2015, provisional application No. 62/213,044, filed on Sep. 1, 2015.

(51) Int. Cl.
| | | |
|---|---|---|
| *C30B 29/22* | (2006.01) | |
| *C30B 7/14* | (2006.01) | |
| *C30B 7/10* | (2006.01) | |
| *C30B 29/62* | (2006.01) | |
| *C30B 33/06* | (2006.01) | |
| *C01F 17/265* | (2020.01) | |
| *C30B 29/12* | (2006.01) | |
| *C01G 49/00* | (2006.01) | |
| *B01L 3/00* | (2006.01) | |

(52) U.S. Cl.
CPC ............... *C01G 49/02* (2013.01); *C30B 7/10* (2013.01); *C30B 7/14* (2013.01); *C30B 29/12* (2013.01); *C30B 29/22* (2013.01); *C30B 29/62* (2013.01); *C30B 33/06* (2013.01); *B01J 2219/0075* (2013.01); *B01J 2219/00331* (2013.01); *B01J 2219/00585* (2013.01); *B01J 2219/00599* (2013.01); *B01J 2219/00686* (2013.01); *B01J 2219/00754* (2013.01); *B01L 3/502784* (2013.01); *B01L 2200/0647* (2013.01); *B01L 2200/0673* (2013.01); *C01P 2004/03* (2013.01); *C01P 2004/16* (2013.01); *C01P 2004/61* (2013.01); *C01P 2004/62* (2013.01); *C01P 2004/64* (2013.01)

(58) Field of Classification Search
CPC ...... B01J 2219/00686; B01J 2219/0075; B01J 2219/00754; B01L 2200/0647; B01L 2200/0673; B01L 3/502784; C01F 17/0062; C01G 49/0045; C01G 49/02; C01P 2004/16; C01P 2004/40; C01P 2004/61; C01P 2004/62; C01P 2004/64; C01P 2004/80; C30B 29/12; C30B 29/16; C30B 29/22; C30B 29/60; C30B 33/06; C30B 7/10; C30B 7/14
See application file for complete search history.

(56) References Cited

U.S. PATENT DOCUMENTS

| 6,506,264 B1 | 7/2003 | Hisano et al. |
| 9,695,468 B2 * | 7/2017 | Hindson ........... B01L 3/502715 |
| 2003/0022242 A1 | 1/2003 | Anderson |

OTHER PUBLICATIONS

Baranov et al., "Assembly of Colloidal Semiconductor Nanorods in Solution by Depletion Attraction," Nano Lett. 2010, 10, 743-749.
Teh et al., "Droplet microfluidics," Lab Chip, 2008, 8, 198-220.
Ahmed et al., "Centimetre scale assembly of vertically aligned and close packed semiconductor nanorods from solution," Chemical Communications, (42): 6421-6423, Sep. 8, 2009.
Fang et al., "pH-Induced Simultaneous Synthesis and Self-Assembly of 3D Layered α-FeOOH Nanorods," Langmuir 2010, 26(4), 2745-2750.
Han et al., "Synthesis and magnetic properties of single-crystalline magnetite nanowires," Journal of Crystal Growth 307 (2007) 483-489.
Singh et al., "Controlled semiconductor nanorod assembly from solution: influence of concentration, charge and solvent nature," J. Mater. Chem., 2012, 22, 1562.
Singh et al., "Insight into the 3D Architecture and Quasicrystal Symmetry of Multilayer Nanorod Assemblies from Moiré Interference Patterns," ACS Nano vol. 6 No. 4 3339-3345, 2012.
Singh et al., "Assembly of CuIn1—xGaxS2 Nanorods into Highly Ordered 2D and 3D Superstructures," ACS Nano vol. 6 No. 8 6977-6983, 2012.
Talapin et al., "A New Approach to Crystallization of CdSe Nanoparticles into Ordered Three-Dimensional Superlattices," Adv. Mater. 2001, 13, No. 24, Dec. 17.
Varanda et al., "Structural and magnetic transformation of monodispersed iron oxide particles in a reducing atmosphere," Journal of Applied Physics vol. 92, No. 4 Aug. 15, 2002.
Vivas et al., "Magnetic anisotropy in ordered textured Co nanowires," Applied Physics Letters 100, 252405 (2012).
Wang et al., "Self-Assembled Colloidal Superparticles from Nanorods," Science Oct. 19, 2012 vol. 338.
Zanella et al., "Self-Assembled Multilayers of Vertically Aligned Semiconductor Nanorods on Device-Scale Areas," Adv. Mater. 2011, 23, 2205-2209.
Zhuang et al., "Cylindrical Superparticles from Semiconductor Nanorods," J. AM. CHEM. SOC. 2009, 131, 6084-6085.

* cited by examiner

METHODS FOR CHARGE-TITRATING PARTICLE ASSEMBLY, AND STRUCTURES PRODUCED THEREFROM

PRIORITY DATA

This patent application is a divisional application of U.S. patent application Ser. No. 15/241,536, filed on Aug. 19, 2016 (now allowed), which claims priority to U.S. Provisional Patent App. No. 62/212,969, filed Sep. 1, 2015, and to U.S. Provisional Patent App. No. 62/213,044, filed Sep. 1, 2015, each of which is hereby incorporated by reference herein.

STATEMENT REGARDING FEDERALLY SPONSORED RESEARCH OR DEVELOPMENT

This invention was made with Government support under DARPA Contract No. FA8650-15-C-7549. The Government has certain rights in this invention.

FIELD OF THE INVENTION

The present invention generally relates to structures and materials containing nanostructured assemblies, and methods of fabricating such assemblies.

BACKGROUND OF THE INVENTION

Tightly packed, organic-free arrays of nanoparticles are useful for optical, magnetic, and electronic device applications. There are existing approaches for forming packed nanoparticles, employing organic ligands in solution to form assemblies. The presence of organic ligands is problematic because the ligands can melt from heat, darken in the presence of light, and inhibit electrical conductivity.

Nanoparticles may be crystallized from solution. Arrays of nanoparticles from crystallization methods are usually surrounded by organic ligands that interfere with further chemical processing and can limit durability. Arrays of nanoparticles from crystallization methods are not protected by an outer layer, which makes them susceptible to environmental damage. Other organic molecules such as surfactants, polymers, or DNA may be used to induce crystallization or assembly.

Nanoparticles may be formed in an array on a substrate. The nanoparticles may be packed using drying from a solution (colloidal crystals) or electrophoresis, both requiring a substrate. Colloidal crystals are formed by dispersing colloids in a solution and drying on a substrate or spin coating on a substrate. Electrophoresis does not necessarily result in tightly packed nanoparticles. Arrays of nanoparticles may be grown in an array on a substrate from a process with gaseous reactants. Nanoparticles may be assembled into aligned arrays under a magnetic field.

Arrays of nanoparticles or nanorods may be formed through a wet chemical process. In one approach, metals or oxides are deposited in the pores of anodic alumina or mesoporous silica. This approach forms either single layers of nanorods or nanorods that have empty space between them and no material between the rods. This results in a low density of material and reduced efficacy from the array.

The packed arrays of nanoparticles, as taught in the prior art, tend to be non-uniform in array size and shape. In order to be useful in larger devices, arrays of assembled particles should be uniform in size and shape. This is necessary for either bottom-up assembly processes, such as self-assembly into larger assemblies; for top-down assembly processes, such as pick-and-place assembly onto patterned substrates; or for combinations of bottom-up and top-down assembly.

What is desired is a method of forming multiple layers of packed nanoparticles, without relying on organic ligands and without relying on a substrate. Devices configured to carry out the method are also needed.

SUMMARY OF THE INVENTION

The present invention addresses the aforementioned needs in the art, as will now be summarized and then further described in detail below.

In some variations, the invention provides a method of assembling a plurality of particles into a particle array, the method comprising:

dispersing a plurality of first particles in a volume of liquid solution, wherein said first particles are characterized by an average zeta potential, and wherein said liquid solution is characterized by a starting pH;

introducing to said liquid solution before, during, or after said first particles are dispersed in said liquid solution, a triggerable pH-control substance capable of generating an acid or a base when triggered; and triggering said pH-control substance to generate an acid or a base within said volume of liquid solution, thereby adjusting solution pH from said starting pH to a titrated pH, wherein said average zeta potential is closer to zero at said titrated pH compared to said starting pH, causing said first particles to assemble into a particle array.

In some embodiments, the first particles are characterized by an average particle size from about 1 nanometer to about 100 microns, such as about 5 nanometers to about 1 micron.

The first particles may contain, for example, a core and a shell, wherein the core comprises a metal, a ceramic, or a combination thereof, and wherein the shell comprises a fluoride, an oxide, a sulfide, or a combination thereof.

The liquid solution may contain, for example, one or more compounds selected from the group consisting of water, dimethyl formamide, dimethylsulfoxide, isopropanol, acetone, tetrahydrofuran, and combinations thereof.

In some embodiments, the pH-control substance is triggered with electromagnetic radiation to generate the acid or the base. For example, the pH-control substance may be a photoacid generator or a photobase generator. Exemplary pH-control substances include sodium tetraphenylborate, and 2-(9-oxoxanthen-2-yl)propionic acid 1,5,7-triazabicyclo[4.4.0]dec-5-ene, and (4-fluorophenyl)diphenylsulfonium triflate.

In these or other embodiments, the pH-control substance is triggered with a change in temperature (such as by heating, cooling, or reaction enthalpy) to generate the acid or the base. For example, the pH-control substance may include urea, carbon dioxide, or a combination thereof.

In some embodiments of the invention, the titrated pH is within 1.5 pH units of the average isoelectric point of the first particles. In certain embodiments, the titrated pH is within 0.5 pH units of the average isoelectric point of the first particles.

In some embodiments of the invention, the rate of change of the solution pH, measured at the titrated pH, is about ±0.05 pH units per minute, or less (i.e., a magnitude of rate of change of 0.05 pH units per minute, or less). In certain embodiments, the magnitude of rate of change of the solution pH, measured at the titrated pH, is about 0.01 pH units per minute, or less.

The average zeta potential, prior to triggering the pH-control substance, is at least ±20 mV (i.e., absolute value or magnitude of 20 mV) and its magnitude is reduced in the method. That is, the zeta potential can start high (positive) and be reduced to a lower value, closer to zero. Or, the zeta potential can start low (negative) and be increased to a higher value (less negative), closer to zero. In some embodiments, the magnitude of average zeta potential is reduced to 10 mV, 5 mV, 2 mV, 1 mV, or less, at the titrated pH compared to the starting pH.

In some embodiments of the invention, the magnitude of average zeta potential of the first particles in the liquid solution changes at a rate from about 1 mV/hr to about 50 mV/hr during adjusting solution pH from the starting pH to the titrated pH. In certain embodiments, the magnitude of average zeta potential changes at a rate from about 5 mV/hr to about 30 mV/hr. When the average zeta potential is decreasing from a positive number toward zero, the rate of change will be negative. When the average zeta potential is increasing from a negative number toward zero, the rate of change will be positive.

The pH-control substance may be triggered uniformly in space within the volume of liquid solution. Alternatively, the pH-control substance may be triggered in a spatial pattern within the volume of liquid solution.

The pH-control substance may be triggered at constant trigger intensity in time, such as for the entire assembly time or for a certain range of time. In some embodiments, the pH-control substance is triggered at a temporally varying trigger intensity. For example, the trigger intensity may be reduced as a function of time.

Two or more different pH-control substances may be introduced to the volume of liquid solution. In some embodiments, one pH-control substance generates an acid when triggered and another pH-control substance generates a base when triggered.

In some embodiments, the method includes intentionally oscillating the solution pH to enhance the assembly of the first particles.

The method may be performed as a batch process, a continuous process, or a hybrid of batch and continuous.

In some embodiments, the method further comprises dispersing a plurality of second particles in the volume of liquid solution; wherein the second particles are distinct chemically and/or physically from the first particles; wherein the second particles are characterized by an average second particle-surface charge; and wherein the average second particle-surface charge is lower at the titrated pH compared to the starting pH, thereby causing the second particles to assemble.

A crystallized assembly containing the first particles may be introduced as a seed material in the volume of liquid solution.

Some variations of the invention provide an array of particles produced by a process comprising:

dispersing a plurality of first particles in a volume of liquid solution, wherein said first particles are characterized by an average zeta potential, and wherein said liquid solution is characterized by a starting pH;

introducing to said liquid solution before, during, or after said first particles are dispersed in said liquid solution, a triggerable pH-control substance capable of generating an acid or a base when triggered; and triggering said pH-control substance to generate an acid or a base within said volume of liquid solution, thereby adjusting solution pH from said starting pH to a titrated pH, wherein said average zeta potential is closer to zero at said titrated pH compared to said starting pH, causing said first particles to assemble into a particle array.

In some embodiments, the array of particles is derived from at least one hundred individual particles, and the array of particles is characterized by a packing density of at least 70 vol %.

Some variations of the invention provide a structure containing an array of particles, wherein the array of particles contains at least one hundred individual particles that are assembled together with a packing density of at least 50 vol %, such as at least 70 vol %, and wherein the particles are essentially free of organic molecules chemically bonded or physically adsorbed to surfaces of the particles. In some embodiments, the particles are characterized by an average particle size from about 5 nanometers to about 1 micron.

Other variations of the invention provide a device for assembling a plurality of particles into one or more particle arrays, the device comprising:
 (a) a droplet-generating microfluidic region;
 (b) a first-fluid inlet port disposed in fluid communication with the droplet-generating microfluidic region;
 (c) a second-fluid inlet port disposed in fluid communication with the droplet-generating microfluidic region;
 (d) a reaction microfluidic region, disposed in fluid communication with the droplet-generating microfluidic region; and
 (e) a trigger source, disposed in at least one of thermal, optical, mechanical, electromechanical, electrical, acoustic, or magnetic communication with at least a portion of the reaction microfluidic region, wherein the trigger source is configured to trigger generation of an acid or a base from a pH-control substance within the reaction microfluidic region.

In some embodiments, the droplet-generating microfluidic region contains a first fluid and a second fluid; wherein the first fluid contains a plurality of particles, a solvent, and the pH-control substance; and wherein the second fluid is substantially immiscible in the first fluid. The particles may be characterized by an average particle size from about 1 nanometer to about 100 microns. The particles may contain a core and a shell, wherein the core comprises a metal, a ceramic, or a combination thereof, and wherein the shell comprises an oxide, a fluoride, a sulfide, or a combination thereof. The first fluid may include one or more compounds selected from the group consisting of water, dimethyl formamide, dimethylsulfoxide, isopropanol, acetone, tetrahydrofuran, and combinations thereof.

In some embodiments, the pH-control substance is triggered with electromagnetic radiation to generate the acid or the base. The pH-control substance, or at least one of the pH-control substances (when more than one is present), may be a photoacid generator or a photobase generator. In these or other embodiments, the pH-control substance, or at least one of the pH-control substances (when more than one is present), is triggered with a change in temperature to generate the acid or the base.

In some devices, the trigger source is configured to uniformly trigger the pH-control substance in space within the reaction microfluidic region. Alternatively, the trigger source may be configured to trigger the pH-control substance in a spatial pattern within the reaction microfluidic region.

Optionally, the trigger source is disposed in electrical communication with a controller to maintain pH within the reaction microfluidic region within a preselected pH range. In some embodiments, the trigger source is disposed in electrical communication with a controller to oscillate pH within the reaction microfluidic region. Optionally, the trigger source is disposed in electrical communication with a controller to maintain pH rate of change within the reaction microfluidic region below a preselected maximum pH rate of change.

During device operation or following some period of operation, the reaction microfluidic region contains one or more particle arrays. Optionally, the device further comprises a particle-array outlet port disposed in fluid communication with the reaction microfluidic region. The device may be configured for continuous operation. An outlet port may allow for continuous removal of particle arrays, or intermittent removal (recovery) of the particle arrays, out of the device or into an intermediate container. In some embodiments, the device further comprising an additional reaction microfluidic region disposed in fluid communication with the reaction microfluidic region.

Some variations provide a method of using the device, the method comprising:

preparing or obtaining a first fluid comprising a plurality of particles to be assembled, a solvent, and the pH-control substance;
preparing or obtaining a second fluid that is substantially immiscible in the first fluid;
flowing the first fluid through the first-fluid inlet port, into the droplet-generating microfluidic region;
flowing the second fluid through the second-fluid inlet port, into the droplet-generating microfluidic region, thereby generating a plurality of droplets containing the first fluid, wherein the droplets are phase-separated from the second fluid;
flowing the droplets into the reaction microfluidic region;
triggering generation of an acid or a base from the pH-control substance, within the reaction microfluidic region; and
titrating pH within the reaction microfluidic region towards the average isoelectric point of the particles.

In some embodiments, the first and second fluids are flowed simultaneously into the droplet-generating microfluidic region.

By titrating the pH within the reaction microfluidic region towards the average isoelectric point of the particles, the particles assemble into a particle array which may be recovered from the reaction microfluidic region. In some embodiments, the titrated pH is within 1.5 pH units, 1.0 units, or 0.5 units of the average isoelectric point of the particles being assembled. The particles may be characterized by an average particle size from about 1 nanometer to about 100 microns.

DETAILED DESCRIPTION OF EMBODIMENTS OF THE INVENTION

Figure 1:
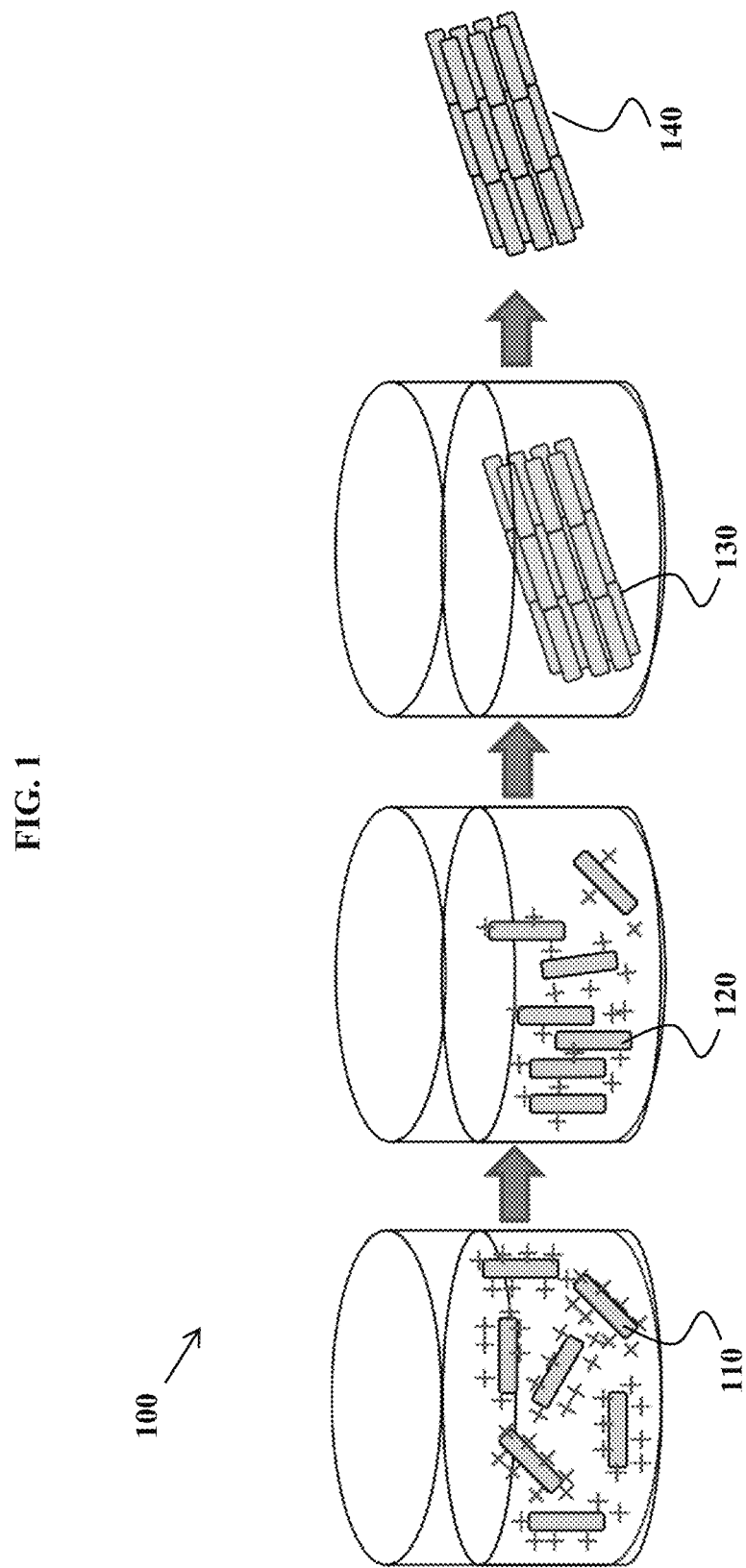
FIG. 1 is an exemplary method schematic, according to some embodiments of the invention.

The compositions, structures, systems, and methods of the present invention will be described in detail by reference to various non-limiting embodiments.

This description will enable one skilled in the art to make and use the invention, and it describes several embodiments, adaptations, variations, alternatives, and uses of the invention. These and other embodiments, features, and advantages of the present invention will become more apparent to those skilled in the art when taken with reference to the following detailed description of the invention in conjunction with the accompanying drawings.

As used in this specification and the appended claims, the singular forms "a," "an," and "the" include plural referents unless the context clearly indicates otherwise. Unless defined otherwise, all technical and scientific terms used herein have the same meaning as is commonly understood by one of ordinary skill in the art to which this invention belongs.

Unless otherwise indicated, all numbers expressing conditions, concentrations, dimensions, and so forth used in the specification and claims are to be understood as being modified in all instances by the term "about." Accordingly, unless indicated to the contrary, the numerical parameters set forth in the following specification and attached claims are approximations that may vary depending at least upon a specific analytical technique.

The term "comprising," which is synonymous with "including," "containing," or "characterized by" is inclusive or open-ended and does not exclude additional, unrecited elements or method steps. "Comprising" is a term of art used in claim language which means that the named claim elements are essential, but other claim elements may be added and still form a construct within the scope of the claim.

As used herein, the phrase "consisting of" excludes any element, step, or ingredient not specified in the claim. When the phrase "consists of" (or variations thereof) appears in a clause of the body of a claim, rather than immediately following the preamble, it limits only the element set forth in that clause; other elements are not excluded from the claim as a whole. As used herein, the phrase "consisting essentially of" limits the scope of a claim to the specified elements or method steps, plus those that do not materially affect the basis and novel characteristic(s) of the claimed subject matter.

With respect to the terms "comprising," "consisting of," and "consisting essentially of," where one of these three terms is used herein, the presently disclosed and claimed subject matter may include the use of either of the other two terms. Thus in some embodiments not otherwise explicitly recited, any instance of "comprising" may be replaced by "consisting of" or, alternatively, by "consisting essentially of."

This invention is predicated on the control of electrical charge on particles in order to assemble the particles into packed arrays.

Some variations provide a method to assemble particles (which may be symmetric or asymmetric) into tightly packed structures or arrays. The method preferably employs spatial and temporal control over the zeta potential of the particles in a parallel manner to achieve alignment and organization of particles, without organic ligands—thereby creating durable, highly thermally stable, and non-photo-darkening packed nanoparticles. Also preferably, this self-assembly method does not require a substrate (i.e., the method works without a substrate, but a substrate may be optionally present), and more preferably, the method does not utilize a substrate. A prerequisite substrate would limit throughput, some processing steps, and end-use applications.

Some variations provide a droplet microfluidic charge-titrating particle-assembly device, which is a device that assembles particles into tightly packed structures or arrays with controlled order and complexity. Some embodiments combine charge-titrating assembly of particles with a droplet microfluidic device. A droplet microfluidic system may be configured to create controlled droplet reaction volumes, thereby enabling uniform assemblies at fast rates, such as rates of $10^9$ particles/second. Furthermore, in some embodiments, the microfluidic system is amenable to the addition of optical patterns, which can add controlled complexity to each assembly through chemical processes such as light-induced plating or photo-dissolution of protective chemical species.

Generally speaking, methods, devices, and systems of the invention may employ charge-titrating particle assembly. By "charge-titrating particle assembly" is meant the assembly of particles contained, along with a solvent, in bulk solution, preferably with spatial and/or temporal control over the zeta potential of the particles to achieve alignment and organization of particles.

Preferably, the assembly of particles does not employ organic ligands on the particles themselves ("organic" means containing carbon). Charge-titrating particle assembly is capable of creating durable, thermally stable, and non-photodarkening packed nanoparticles. Furthermore, charge-titrating particle assembly does not require a substrate, a prerequisite that limits throughput, some processing steps, and certain end-use applications.

When combined with a suitable droplet microfluidic device, charge-titrating particle assembly can create uniform, mono-disperse structures or arrays with controlled order and complexity. Tightly packed, monodisperse, organic-free arrays of particles (e.g., nanoparticles) are useful for optical, magnetic, and electronic device applications, among other potential uses. Charge-titrating particle assembly, in some embodiments, forms multiple layers (such as 2, 3, 4, 5, 6, 7, 8, 9, 10 or more layers) of packed nanoparticles without organic ligands and without a substrate.

The ability to add to controlled complexity in the form of controlled, spatially non-uniform patterns on the assemblies, enables wider functionality of the assemblies than (i) homogenous assemblies of one type of particle or (ii) core-shell arrangements of assemblies. Controlled complexity, for instance, enables ring resonators and split-ring resonators, which are building blocks of electromagnetic (including optical) metamaterials.

In some embodiments (such as fluoride-based nanoparticles), the nanoparticles may have inorganic ligands (e.g., tetrafluoroborate, $BF_4^-$ ligands) or other organic-free, positively or negatively charged ligands or hydrophilic ligands on the surface to help keep them dispersed in water. When present, the ligands may be loosely bound such that a zeta potential response with pH is observed.

Note that organic groups (including organic ligands) may be present in the solvent which is distinct from the particles in bulk solution. Also, organic material (e.g., an organic polymer) may be contained within or on the particles, but preferably not as organic ligands. In some embodiments, substantially no organic material is present on the particles. "Substantially no organic material," "free of organic ligands," and like terminology should be construed to recognize that there may be impurities or other species unintentionally present in these material assemblies, which do not significantly impact the properties of the material assemblies. One of ordinary skill in the art will also realize that organic ligands could in principle be incorporated after the formation (without using organic ligands) of the assembly; the scope of the present invention includes this embodiment.

Preferred methods do not employ a functional substrate, which means a solid substrate that chemically or physically enhances the charge-titrating particle assembly or array formation, with particles being deposited on the substrate. It should be recognized that a non-functional substrate may be included, such as an incidental substrate layer, an ornamental layer, or an adjacent layer. One of ordinary skill in the art will also realize that a substrate could in principle be incorporated after the formation (without using a substrate) of the assembly; the scope of the present invention includes this embodiment.

Preferred embodiments of the invention provide tightly packed nanoparticles that are assembled in solution and not on a substrate. The nanoparticles are preferably free of organic ligands and the assemblies are preferably anisotropic structures.

In some embodiments, fully formed nanoparticles are assembled, instead of combining the synthesis of the nanoparticles themselves with the assembly process.

A variety of particle shapes are possible. Particles may be round, cylindrical, elliptical, diamond-shaped, cubic, or hexagonal prism structures, for example. Mixtures of particle shapes may be employed. In some embodiments, the ratio between the shortest and longest dimension is from about 1:1 to about 1:5.

A variety of particle sizes are also possible. In some embodiments, the average particle size (prior to array formation) is from about 1 nanometer to about 100 microns, preferably from about 1 nanometer to about 1 micron. In some preferred embodiments, at least some of the particles are nanoparticles, which may be construed to mean particles having a particle size or at least one dimension below 1 micron. In certain preferred embodiments, all of the particles are nanoparticles, prior to array formation. Much of the remaining disclosure will assume that the particles are nanoparticles, it being understood that the principles of the invention may be applied to microparticles (particles having a particle size of 1 micron or higher) as well.

The nanoparticles may be symmetric or asymmetric. If the nanoparticles are asymmetric, the long axes of individual nanoparticles are preferably aligned in the same direction with respect to one another in the arrays. "Aligned" in this sense means that the long axis of the nanoparticles has a full width at half maximum angular distribution with respect to the array alignment direction of at most about ±20°, more preferably at most about ±10°, and most preferably at most about ±5°.

An "array" or equivalently "assembly" or "packed structure" as intended herein, means a plurality of nanoparticles that are packed together and touching or near touching. In the array, the center-to-center distance between nanoparticles is preferably less than the width of two nanoparticles. More preferably, the center-to-center distance between nanoparticles is less than the width of 1.5 nanoparticles.

The nanoparticles may form multilayer packed structures/arrays in solution. "Multilayer" means at least 2 layers, preferably at least 4 layers, more preferably at least 10 layers, and even more preferably at least 25 layers. Each layer is counted along a continuous layer of nanoparticles. Although nanoparticles preferably assemble into layers within the array, it is also possible to assemble the nanoparticles into a 3-dimensional array without distinct layers in one or more of the dimensions.

The nanoparticles may comprise a fluoride, an oxide, a sulfide, or a combination thereof. In some preferred embodiments, the nanoparticles include or consist essentially of fluorides. The nanoparticles have an average isoelectric point that may be measured using a zeta potential measurement. The isoelectric point is the pH where the zeta potential is 0. Note that "oxides" also includes hydroxides and oxyhydroxides.

In some embodiments, the nanoparticle contains a core of a metal and a shell that is or includes an oxide, fluoride, sulfide, or combination thereof. In these or other embodiments, the nanoparticle contains a core of metal and a shell that is or includes an oxide, fluoride, sulfide, or combination thereof. In these or other embodiments, the nanoparticle contains a core of a ceramic (or ceramic with metal) and a shell that is or includes an oxide, fluoride, sulfide, or combination thereof.

The oxide, fluoride, or sulfide may be metal oxides, metal fluorides, metal sulfides, or another material (e.g., polymer or ceramic) in oxide, fluoride, or sulfide form. The oxide, fluoride, or sulfide may be present as carbon-free O-containing groups, carbon-free F-containing groups, or carbon-free S-containing groups, respectively, chemically bonded to the nanoparticle core.

The bulk solution contains a solvent which may be selected from water, dimethyl formamide, dimethylsulfoxide, isopropanol or another alcohol, acetone, tetrahydrofuran, or mixtures of these solvents. The solvent preferably contains water.

Figure 2:
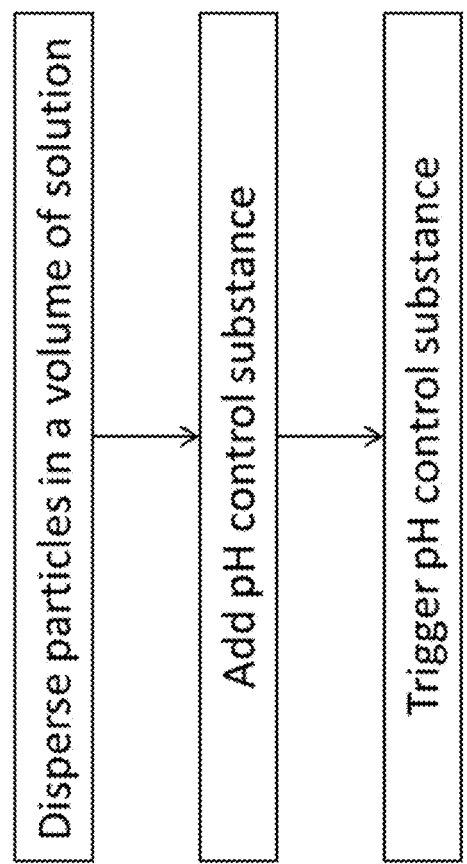
FIG. 2 is an exemplary flowchart of some methods of the invention.

An exemplary method schematic is shown in FIG. 1 and flowchart is shown in FIG. 2. Some embodiments will now be further described.

Nanoparticles may be dispersed (i.e., dissolved and/or suspended as a colloid) in solution by adjusting the solution pH to increase the zeta potential above +20 mV or below −20 mV. In this disclosure, the notation "±20 mV" (for example) in reference to zeta potential means that the zeta potential is 20 mV in magnitude (absolute value) and may be either 20 mV or −20 mV; this does not refer to a range of values between −20 mV to 20 mV.

The nanoparticles should be already formed (as individual nanoparticles) and not a solution of precursors. (A precursor for example would be a metal salt that contains cations or anions, matching the intended composition of the nanoparticles.) In some embodiments, a seed of assembled nanoparticles could be added to a dispersed solution of the same nanoparticles.

A salt such as NaCl, preferably with cations or anions that are not common with the nanoparticle composition, may be added to change the screening of electrostatic charges in solution. Electrostatic repulsion prevents the particles from agglomerating and may be controlled with initial pH. Brownian motion, sonication, gas sparging, and/or bulk mixing (e.g., agitation or vessel rotation) may be used to keep the nanoparticles suspended in solution.

In addition to the nanoparticles, one or more triggerable pH-control substances are added to the solution. The triggerable pH-control substance is preferably selected from thermal acid generators, thermal base generators, photoacid generators, photobase generators, or a combination of the foregoing. A "photoacid generator," or "photoacid," is a molecule which releases an acid, or becomes more acidic upon absorption of light. This may be due either to the release of strong acids upon photolysis, or to formation of a strongly acidic excited state. A "photobase generator," or "photobase," is a molecule which releases a base, or becomes more basic upon absorption of light. This may be due either to the release of strong bases upon photolysis, or to formation of a strongly basic excited state. In this disclosure, a "strong acid" means an acid with a pKa value less than 4, such as less than 3, 2, 1, 0, −1, or −2. A strong base" means a base with a pKb value less than 4, such as less than 3, 2, 1, 0, −1, or −2.

The triggerable pH-control substance may be capable of controllably generating a Lewis acid, a Brønsted acid, or an acid that is both a Lewis acid and a Brønsted acid. Similarly, the triggerable pH-control substance may be capable of controllably generating a Lewis base, a Brønsted base, or an acid that is both a Lewis base and a Brønsted base.

As an example, (4-fluorophenyl)diphenylsulfonium triflate is a photoacid generator and creates protons ($H^+$ ions) in response to UV light. As another example, sodium tetraphenylborate is a photobase generator and creates hydroxide ions in response to UV light. Another example is 2-(9-oxoxanthen-2-yl)propionic acid 1,5,7-triazabicyclo[4.4.0]dec-5-ene which is a photobase generator that contains multiple functional groups.

Urea is a thermal base generator and creates base (ammonia) from exposure to temperatures above 50° C. Sulfonate salts may be employed as thermal acid generators, creating protons ($H^+$ ions) in response to heat.

Note that some thermal acid/base generators are effective when temperature is reduced, rather than increased. For example, carbon dioxide solubility in solvent can be shifted, with temperature. Changing solubility will shift the carbon dioxide-carbonic acid equilibrium, resulting in a change in pH. In particular, lowering temperature will increase $CO_2$ solubility and result in acidification (via carbonic acid) of an aqueous medium.

Alternatively, or additionally, the triggerable pH-control substance may be triggered by something other than heat or electromagnetic radiation. Possible triggers include sound energy (sonication), or a trigger molecule (such as $CO_2$) which could be bubbled through solution, for example.

The solution is contained or placed in a container that preferably (i) does not lose physical integrity during heating and/or (ii) allows the transmission of light.

The pH of the solution is then titrated towards the isoelectric point, preferably uniformly (in space) within the solution to induce assembly of the nanoparticles. The pH titration is accomplished with the triggerable pH-control substance(s), such as a thermal acid/base generator or a photoacid/base generator, by heating the solution and/or exposing it to light at one or more effective wavelengths, thereby triggering the triggerable pH-control substance(s) so that pH is titrated in a controlled manner.

It is noted that agglomerated nanoparticles may be formed by adjusting the pH of a solution of dispersed nanoparticles with an acid or base solution, to near the isoelectric point of the nanoparticles. However, these nanoparticles will not be tightly packed. Therefore, in preferred embodiments of the present invention, the solution pH should not be changed by only adding acid or base solutions, because this will result in pH spatial gradients in the solution. Such pH gradients will result in uncontrolled agglomeration instead of assembly of nanoparticles into tightly packed arrays.

In the present invention, "tightly packed" means a packing density of at least about 50 vol %, preferably at least about 60 vol %, more preferably at least about 70 vol %, even more preferably at least about 80 vol %, yet more preferably at least about 85 vol %, and most preferably at least about 90 vol %. The packing density is 100% minus the void (volume) density, i.e., tighter packing means fewer voids, and conversely, lower-density packing means a greater density of voids (open space). In certain embodiments, the packing density approaches 100 vol % of the theoretical packing density for the shape(s) of particles present.

It has been discovered that normal titration creates localized pockets of pH changes from gradients in added acid or bases, which gradients are undesirable. Uniform pH titration is desired in order to create tightly packed arrays of nanoparticles. Uniform pH titration is enabled by the use of a triggerable pH-control substance. Without wishing to be bound by theory, it is believed that uniform (in solution) pH titration is important because it allows control of particle surface charge. Changes in pH change the particle surface charge, which may be measured as surface-charge density.

Furthermore, the use of a triggerable pH-control substance allows the rate of change of pH to be controlled, by controlling the heat (or cooling) input or the amount of UV light input. It has been discovered experimentally that a preferred magnitude (absolute value) of rate of pH change is about 0.01 pH units per minute, or less, at or near the isoelectric point of the particles being assembled. When the pH is rising, the rate of pH change will be positive, and when the pH is falling, the rate of pH change will be negative. Thus "±0.01 pH units per minute, or less" means for example 0.01, 0.009, 0.008 or −0.01, −0.009, −0.008, and so on. In various embodiments, the rate of pH change is about ±0.05, ±0.04, ±0.03, ±0.02, ±0.01, ±0.009, ±0.008, ±0.007, ±0.006, ±0.005, ±0.004, ±0.003, ±0.002, ±0.001 pH units per minute, or less, measured at or near the isoelectric point of the particles being assembled. "Near the isoelectric point" means that the pH is within 2.0, 1.5, 1.0, 0.5, or 0.1 pH units of the isoelectric point. The pH rate of change may also be measured when the zeta potential of the assembling particles is in the range of −20 mV to +20 mV, −10 mV to +10 mV, −5 mV to +5 mV, −2 mV to +2 mV, or about 0 mV.

In some embodiments, heating or light exposure to the solution preferably is stopped when the solution pH is within 2.0, 1.9, 1.8, 1.7, 1.6, 1.5, 1.4, 1.3, 1.2, 1.1, 1.0, 0.9, 0.8, 0.7, 0.6, 0.5, 0.4, 0.3, 0.2, or 0.1 pH units of the isoelectric point of the particles being assembled. In these or other embodiments, heating or light exposure to the solution preferably is stopped when the zeta potential of the assembling particles is in the range of −15 mV to +15 mV, −10 mV to +10 mV, or −5 mV to +5 mV, for example. In some embodiments, heating or light exposure is reduced but not completely stopped at some intermediate solution pH or intermediate zeta potential, and then the heating or light exposure is completely stopped at a second solution pH (that is closer to the isoelectric point of the particles being assembled) or a second zeta potential (that is lower than the intermediate zeta potential). A buffer may optionally be used to slow down the rate of pH change near the isoelectric point or at other points during the titration.

The average zeta potential, prior to triggering the pH-control substance, is at least ±20 mV (i.e., +20 mV or more, or alternatively, −20 mV or less) and its magnitude is reduced in the method. That is, the zeta potential can start high (positive) and be reduced to a lower value, closer to zero. Or, the zeta potential can start highly negative and be increased to a lower magnitude (less negative), closer to zero. Thus for example when the average zeta potential is reduced from ±20 mV to ±10 mV, this ±notation means that either the average zeta potential is reduced from +20 mV to +10 mV, or increased mathematically (but reduced in magnitude) from −20 mV to −10 mV. In some embodiments, the average zeta potential is reduced to ±10 mV, ±5 mV, ±2 mV, ±1 mV, or less, at the titrated pH compared to the starting pH.

In some embodiments of the invention, the average zeta potential of the first particles in the liquid solution changes at a rate from about ±1 mV/hr to about ±50 mV/hr, i.e. a magnitude (absolute value) from about 1 mV/hr to about 50 mV/hr. In certain embodiments, the average zeta potential changes at a rate from about ±5 mV/hr to about ±30 mV/hr, i.e. a magnitude from about 5 mV/hr to about 30 mV/hr. The values may be positive or negative since the zeta potential may start negative or positive, and approach zero. In particular, when the average zeta potential is decreasing from a positive number toward zero (e.g. from 10 mV to 1 mV), the rate of change will be negative. When the average zeta potential is increasing from a negative number toward zero (e.g. from −10 mV to −1 mV), the rate of change will be positive.

In some embodiments, the first particles are characterized by an average surface-charge density. When the pH-control substance is triggered to generate an acid or a base within the volume of liquid solution, thereby adjusting solution pH from the starting pH to a titrated pH, the average surface-charge density is lower at the titrated pH compared to the starting pH, thereby causing the first particles to assemble into a particle array. The average surface-charge density (at the titrated pH) may be, for example, from about 0 to about 0.05, 0.1, 0.15, 0.2, or 0.25 number of charges per $nm^2$ of surface.

The assembled nanoparticles are then separated from the solution. This separation may be done with centrifugation, filtration, evaporation of the solution, etc. The array of assembled nanoparticles is optionally dried to remove any residual solution. The array may then be utilized as a nanoparticle-containing object.

Many additional variations on the process are possible.

The pH of the solution, and thus the zeta potential of the particles being assembled, may be controlled temporally, spatially, or both temporally and spatially. In some embodiments employing temporal pH control, the intensity of UV light (or another suitable electromagnetic source) decreases over time to change the pH and thus the zeta potential more slowly as the isoelectric point is approached. The decrease could be gradual and continuous, or could be periodic step decreases, for example. In some embodiments employing spatial pH control, UV light (or another suitable electromagnetic source) is masked with a single-tone, two-tone, or gray-scale mask. Holography or interference lithography may also be employed, for example, in some embodiments employing spatial pH control, In some embodiments, the pH of the solution is varied in both time and in space to optimize the packing, such as to increase the size and/or alignment of the arrays. For example, a zone refinement could be implemented in which the solution is illuminated in a plane from a linear or near-linear source and the plane of illumination is translated through the solution volume, as a function of time.

The pH of the solution, and thus the zeta potential of the particles being assembled, may be oscillated in time to refine the packing, such as to increase the size and/or alignment of the arrays. For example, pH oscillation may be triggered by placing both a photoacid and a photobase in the solution, wherein the photoacid and photobase are susceptible to two different wavelengths, and then alternately exposing the solution to the two wavelengths.

In some embodiments, multiple pH control substances are utilized. The multiple pH control substances may have different triggers (e.g. one thermal trigger and one electromagnetic radiation trigger) or two of the same type of trigger but with different characteristics (e.g., electromagnetic radiation at two substantially different wavelengths). In certain embodiments, two of the multiple pH-control substances could act in opposite directions on pH (e.g. when triggered, one could generate acid while another could generate base). Selectively triggering one of the multiple pH-control substances, and then another, could be used to oscillate pH of the solution.

After a first set of particles is assembled, a second set of nanoparticles may be added to the solution. Then an existing (in solution) pH control-substance may be triggered, or a new pH control-substance may be added and triggered. The second set of nanoparticles preferably has a different isoelectric point from the first set of nanoparticles.

Figure 3:
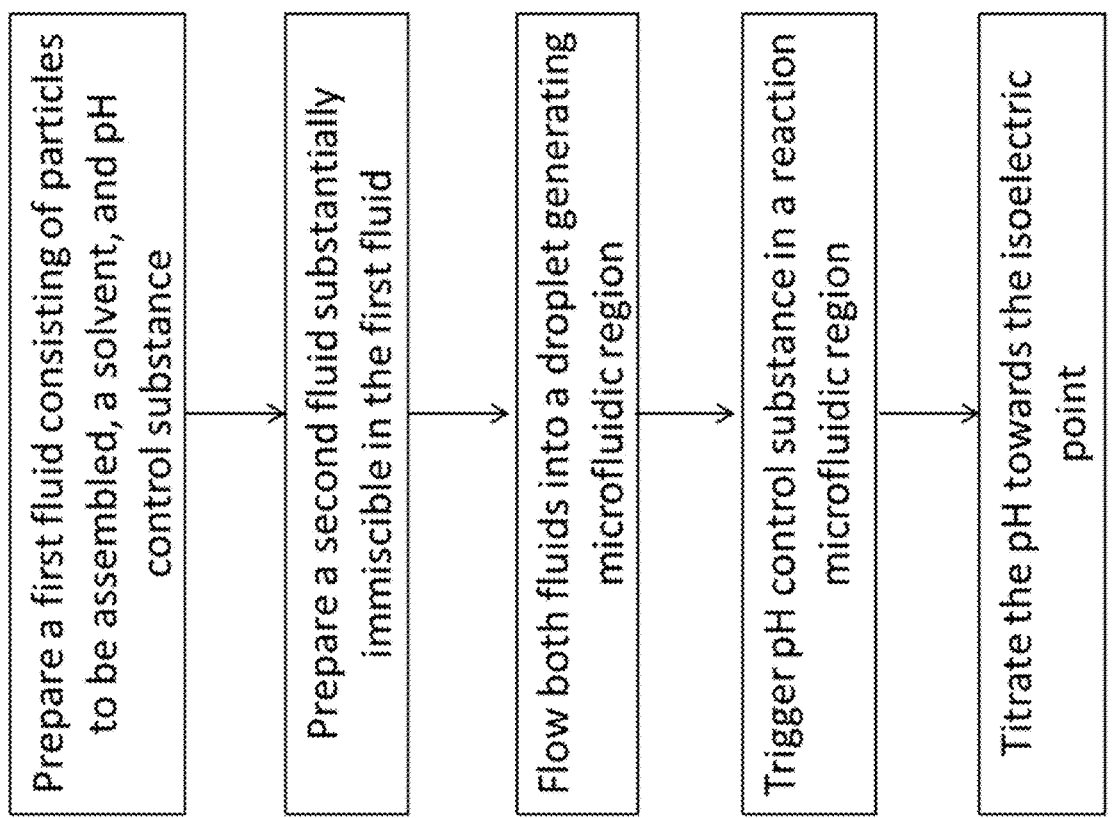
FIG. 3 is an exemplary flowchart of some methods of the invention.

An exemplary approach of forming nanoparticle arrays is shown schematically in the diagram of FIG. 1. The process 100 includes dispersing charged nanoparticles 110 along with at least one triggerable pH-control substance (not shown). The surface charge on the nanoparticles 110 is then decreased by triggering the triggerable pH-control substance, such as with heat or light, to generate nanoparticles 120 with an average zeta potential closer to zero. The nanoparticles 120 begin to align. With further, gradual reduction in surface charge, assembly/alignment occurs, to generate an assembly 130 of aligned nanoparticles. The assembly 130 may be removed from solution to recover nanoparticle three-dimensional arrays 140 comprise aligned nanorods. FIGS. 2 and 3 illustrate (by flowchart) the assembly process steps, in various embodiments.

The assembly of the nanoparticles, in various embodiments, is characterize by an assembly rate (particles assembled per second) of about $10^6$, $10^7$, $10^8$, $10^9$, $10^{10}$, $10^{11}$, $10^{12}$ or more.

In some embodiments, the method further comprises dispersing a plurality of second particles in the volume of liquid solution; wherein the second particles are distinct chemically and/or physically from the first particles; wherein the second particles are characterized by an average second particle-surface charge; and wherein the average second particle-surface charge is lower at the titrated pH compared to the starting pH, thereby causing the second particles to assemble.

A crystallized assembly containing the first particles may be introduced as a seed material in the volume of liquid solution.

Some embodiments are premised on incorporating an additional step of collecting the assembled particles, resuspending them in a new solution, adding additional particles, and triggering a pH change again.

Some embodiments provide a method of assembling a plurality of particles into a particle array, the method comprising:

dispersing a plurality of first particles in a volume of liquid solution, wherein the first particles are characterized by an average particle-surface charge and average zeta potential, and wherein the liquid solution is characterized by a starting pH;

introducing to the liquid solution before, during, or after the first particles are dispersed in the liquid solution, a triggerable pH-control substance capable of generating an acid or a base when triggered;

triggering the pH-control substance to generate an acid or a base within the volume of liquid solution, thereby adjusting solution pH from the starting pH to a titrated pH, wherein the average particle-surface charge magnitude, and zeta potential, are closer to zero at the titrated pH compared to the starting pH, thereby causing the first particles to assemble into a first particle array;

dispersing a plurality of second particles within a volume of second liquid solution, wherein the second particles are characterized by a second average particle-surface charge and second average zeta potential, and wherein the second liquid solution is characterized by a second starting pH;

introducing to the second liquid solution before, during, or after the second particles are dispersed in the second liquid solution, a second triggerable pH-control substance capable of generating an acid or a base when triggered; and triggering the second pH-control substance to generate an acid or a base within the volume of second liquid solution, thereby adjusting second solution pH from the second starting pH to a second titrated pH, wherein the second average particle-surface charge and second average zeta potential are closer to zero at the second titrated pH compared to the second starting pH, thereby causing the second particles to assemble into a second particle array which may be distinct from the first particle array, or combined with the first particle array in a composite particle array, for example.

Some variations of the invention provide an array of particles produced by a process comprising:

dispersing a plurality of first particles in a volume of liquid solution, wherein the first particles are characterized by an average particle-surface charge and an average zeta potential, and wherein the liquid solution is characterized by a starting pH;

introducing to the liquid solution before, during, or after the first particles are dispersed in the liquid solution, a triggerable pH-control substance capable of generating an acid or a base when triggered; and triggering the pH-control substance to generate an acid or a base within the volume of liquid solution, thereby adjusting solution pH from the starting pH to a titrated pH, wherein the average particle-surface charge and zeta potential are closer to zero at the titrated pH compared to the starting pH, thereby causing the first particles to assemble into an array of particles.

In some embodiments, the array of particles includes or is derived from at least 10, 50, 100, 200, 300, 400, or 500 individual particles, and the array of particles is characterized by a packing density of at least 50%, 60%, 70%, 80%, or 90% on a volume basis.

Some variations of the invention provide a structure containing an array of particles, wherein the array of particles contains at least one hundred individual particles that are assembled together with a packing density of at least 50 vol %, and wherein the particles are essentially free of organic molecules chemically bonded or physically adsorbed to surfaces of the particles. In some embodiments, the particles are characterized by an average particle size from about 5 nanometers to about 1 micron.

Some variations of the invention provide a droplet microfluidic device to form tightly packed nanoparticle arrays. A "droplet microfluidic" device means that reactions occur within droplets that are formed within the device. Essentially, droplets are used as microreactors. Embodiments of the invention also provide methods to operate the device.

Figure 4A:
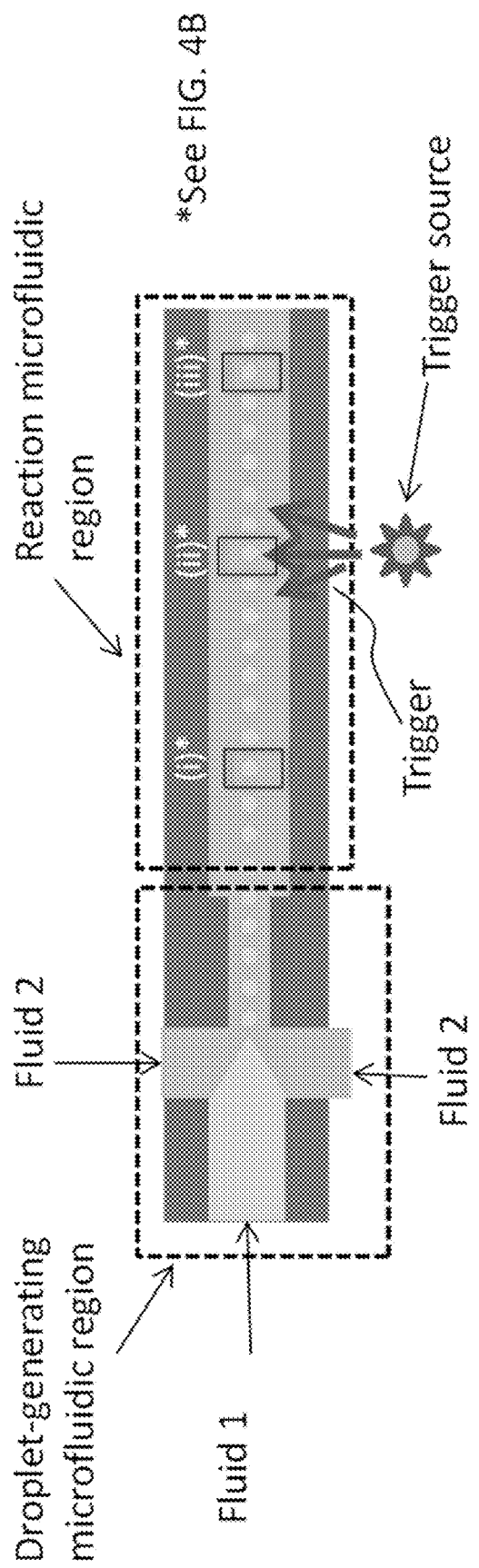
FIG. 4A is a schematic of a microfluidic particle assembly device, in some embodiments.
Figure 4B:
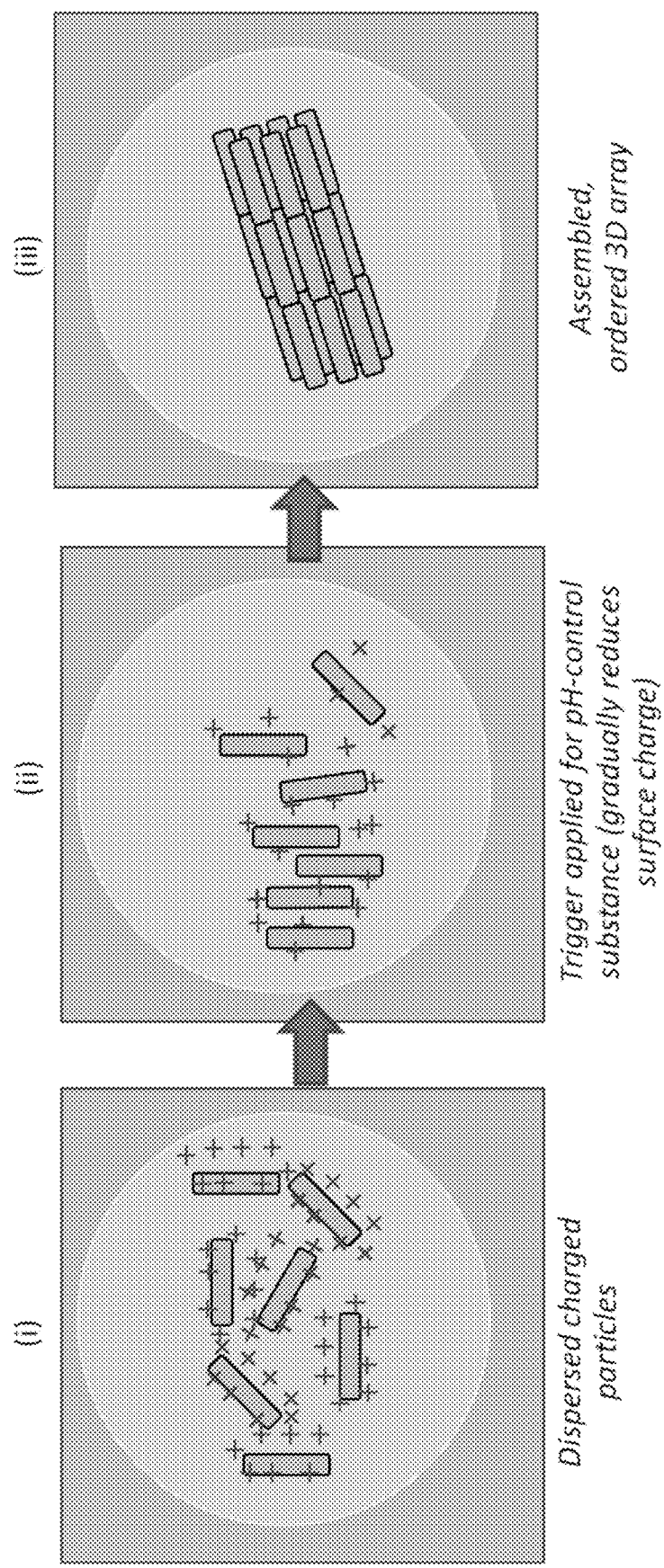
FIG. 4B is an illustration of particle assembly occurring within single droplets contained in the device of FIG. 4A.

An exemplary approach of forming nanoparticle arrays, using the device of some embodiments, is shown schematically in FIG. 4A/4B where the nanoparticles are nanorods. FIG. 4A is a schematic of a microfluidic particle assembly device, in some embodiments. FIG. 4B is an illustration of particle assembly occurring within single droplets contained in the device of FIG. 4A.

The droplet microfluidic device, such as depicted in FIG. 4A, contains a first fluid inlet (e.g., port or valve), a second fluid inlet, a droplet-generating microfluidic region, a reaction microfluidic region, and a trigger source. Multiple inlets for the fluids may be present, as depicted in FIG. 4A which shows two inlets for the second fluid. In some embodiments, there is a single inlet for the second fluid. In some embodiments, the device under operation actually contains the first and second fluids.

The first fluid contains a solvent such as water, dimethyl formamide, dimethylsulfoxide, isopropanol or another alcohol, acetone, tetrahydrofuran, or mixtures of any of these solvents. The solvent most preferably contains water.

The first fluid contains the particles (e.g., nanoparticles) to be assembled. The particles may have at least one dimension from about 1 nanometer to about 100 microns, preferably from 1 nanometer to 1 micron, i.e., preferably nanoparticles. The nanoparticles may include an oxide, fluoride, sulfide, or combination thereof. The nanoparticles may include a core of a metal and a shell that is an oxide, fluoride, sulfide, or combination thereof. Alternatively, or additionally, the nanoparticle may have a core of a ceramic and a shell that is an oxide, fluoride, sulfide, or combination thereof.

The first fluid also contains a pH-control substance that is activated by a trigger. The trigger may be thermal, optical, mechanical, electromechanical, electrical, acoustic, etc., or a combination of multiple triggers. When activated by the trigger, the pH-control substance generates an acid or a base. The activation may be instantaneous wherein all of the acid or base is generated at once. Alternatively, the activation may be gradual wherein continued application of the trigger results in more acid or base generation. The pH-control substance is preferably uniformly distributed within the first fluid.

Multiple pH-control substances may be present in the first fluid. The multiple pH-control substances could all generate acid, all generate base, or some could generate acid and some could generate base. The multiple pH-control substances are preferably uniformly distributed within the first fluid.

The second fluid preferably is immiscible in the first fluid, and vice-versa. If the second fluid remains a continuous phase in the droplet-generating microfluidic region, the trigger preferably is able to penetrate the second fluid. For instance, if the trigger is thermal, the second fluid preferably conducts heat and preferably does not absorb heat, such as in an endothermic phase change. If the trigger is optical, the second fluid preferably is optically transparent, at least at one of the trigger wavelengths.

Exemplary second fluids include, but are not limited to, mineral oil, fluorinated oils, silicone oils, alkanes, and alkenes.

In the droplet-generating microfluidic region (see FIG. 4A), both the first and second fluids preferably enter the droplet-generating region as continuous phases. The first fluid forms a dispersed phase in the droplet-generating microfluidic region. The second fluid may remain a continuous phase in the droplet-generating microfluidic region, or the second fluid may also form a dispersed phase in the droplet-generating microfluidic region. In the reaction microfluidic region, physical, chemical, electrical, or electrochemical reactions may take place to assemble dispersed charged nanoparticles into ordered three-dimensional arrays. Typically, assembly by changing of surface charge may be thought of as a physical reaction and/or an electrical reaction. The reaction is triggered, at least in part, from a trigger source as shown in FIG. 4A.

In the droplet-generating microfluidic region, the first fluid is changed from a continuous phase to a dispersed phase which forms the small droplets in FIG. 4A (the droplets are zoomed-in for FIG. 4B). Because the concentration of particles and pH-control substance(s) is uniform throughout the first fluid, each resulting droplet has the same composition. That is, each droplet contains the same or a similar concentration of particles as well as the same or a similar concentration of pH-control substance(s). The droplets of the dispersed phase of the first fluid are typically uniform in size, which means the droplets each contain similar amounts (i.e., mass) of particles and pH-control substance(s). The droplets are not particularly limited in size, but the droplet size is large enough to contain multiple nanoparticles.

The droplet-generating microfluidic region may include a flow-focusing device, a T-junction device, a dielectrophoresis droplet-generating device, or an electrowetting on dielectric (EWOD) device. A flow-focusing device is preferable.

In some embodiments, the droplet-generating microfluidic region utilizes additional fluids (as the "first fluid" component). For example, the droplet-generating microfluidic region may be configured to bring together parts of multiple fluids inside a single droplet. These fluids may mix prior to droplet formation, during droplet formation, or after droplet formation. The fluids may all contain particles and pH-generating substances, or one or more fluids may contain particles while one or more other fluids may contain pH-generating substances.

The reaction microfluidic region preferably does not break down under application of the trigger. That is, reaction microfluidic region should be fabricated to withstand heat and/or optical illumination. In some embodiments, both the droplet-generating microfluidic region as well as the reaction microfluidic region are fabricated to withstand heat and/or optical illumination.

Each microfluidic region (i.e., the droplet-generating microfluidic region as well as the reaction microfluidic region) may be made by any standard microfluidic fabrication method; see, for example, Iliescu et al., A practical guide for the fabrication of microfluidic devices using glass and silicon," *Biomicrofluidics* 2012 March; 6(1): 016505-16, which is hereby incorporated by reference herein for details of exemplary fabrication procedures. Examples include molded polymers (such as polydimethylsiloxane, polymethylmethacrylate, polycarbonate, and cyclic olefin (co)polymers); wet-etched, dry-etched, or plasma-etched glass; wet-etched, dry-etched, or plasma-etched silicon; molded glass; laser cut/patterned glass; micro-sandblasted glass, etc.

Each microfluidic region may be made by additively manufacturing (e.g. via stereolithography) a sacrificial pattern for the microfluidic passages, conformally coating the passages (such as with parylene) or infiltrating with a bulk material, and then selectively removing the sacrificial pattern, such as by chemical etching with NaOH. See Roper et al., "Scalable 3D Bicontinuous Fluid Networks: Polymer Heat Exchangers Toward Artificial Organs" *Adv. Mater.* 2015, 27: 2479-2484, which is hereby incorporated by reference herein.

The trigger source may be a source of energy that is thermal, optical, mechanical, electromechanical, electrical, acoustic, magnetic, or another effective source to trigger a selected pH-control substance. Combinations of trigger sources may also be employed, such as thermomechanical sources providing both heat as well as mechanical energy.

If the trigger is thermal, the trigger source may be a resistive Joule heater, such as a patterned resistive element on the inside or outside wall of the reaction microfluidic region. If the trigger is thermal, the trigger source may be a convective heater (or cooler), in which another, hotter or colder fluid passes through a microfluidic passage adjacent to the reaction microfluidic region. Thermoelectric devices or materials, or infrared heaters, may also be employed for thermal triggers. An intense light or IR lamp may also heat the tube.

If the trigger is optical or electromagnetic, the trigger could be for example a light-emitting diode, a laser, an ultraviolet lamp, an incandescent lamp, or a halogen lamp. In some of these embodiments, the device may be referred to as an opto-microfluidic device or droplet opto-microfluidic device.

The trigger optionally is spatially patterned in the reaction microfluidic region. In some embodiments, the trigger pattern is configured to change on a length scale greater than the droplet size, so that entire droplets are triggered rather than portions thereof. As one example, the heat flux into or out of the channel may increase or decrease along the flow direction in the reaction microfluidic region. Similarly, light input into the channel may increase or decrease along the flow direction in the reaction microfluidic region. In other embodiments, the trigger pattern changes on a length scale less than the droplet size. For instance, the light could be patterned using optical interference, shadow masking, or other known means to generate a spatially varying pattern at a fine length scale. In related embodiments, the trigger pattern varies on multiple length scales.

The trigger optionally is patterned in time, in the reaction microfluidic region. For instance, an optical signal may be modulated to flash briefly as each particle passes by.

Figure 5A:
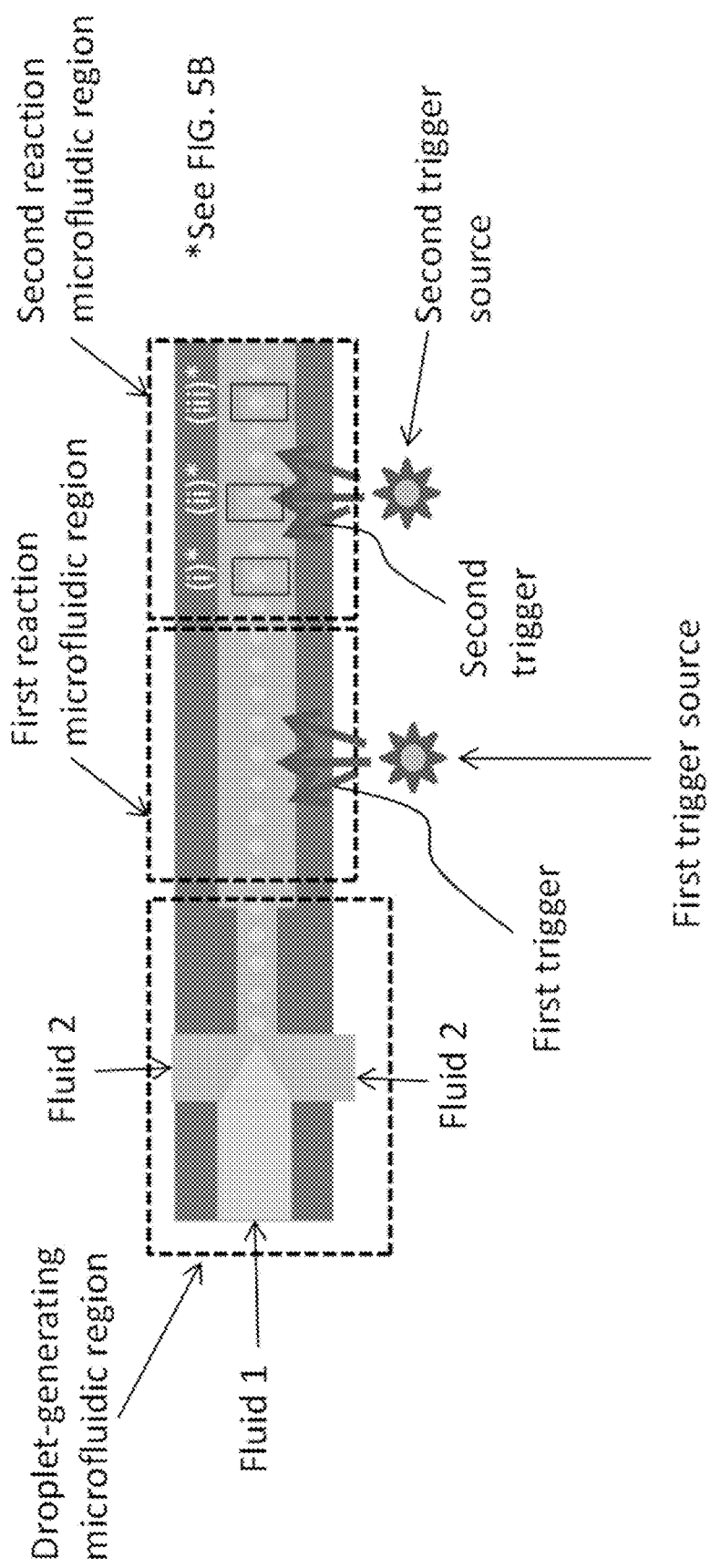
FIG. 5A is a schematic of a microfluidic particle assembly device with two assembly stages used to create core-shell assemblies of two particles, in some embodiments.
Figure 5B:
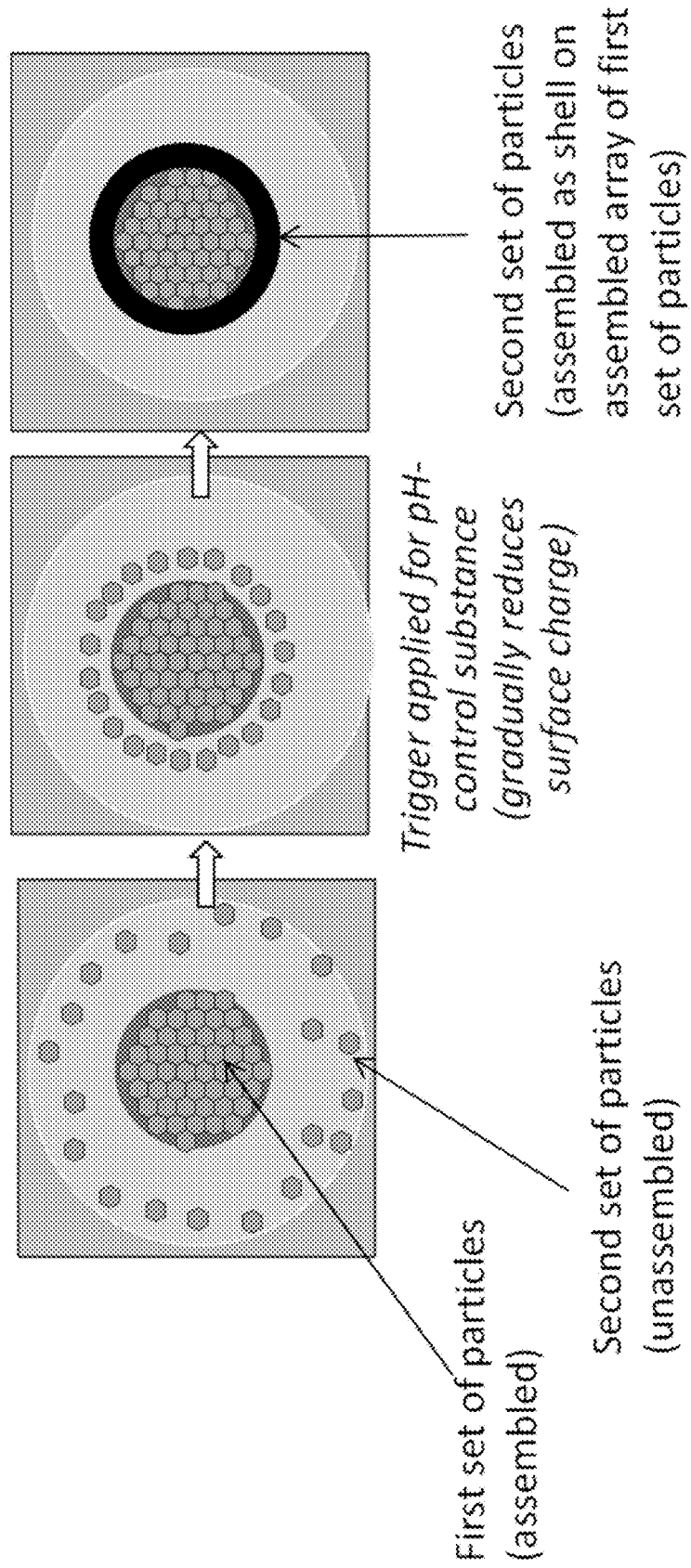
FIG. 5B is an illustration of particle assembly occurring within single droplets contained in the device of FIG. 5A.

In some embodiments, multiple trigger sources are present, either at the same physical location or at separate locations within the reaction microfluidic region. For example, FIG. 5A is a schematic of a microfluidic particle assembly device with two assembly stages used to create core-shell assemblies of two particles, in some embodiments. FIG. 5B is an illustration of particle assembly occurring within single droplets contained in the device of FIG. 5A.

An optional interface stabilization substance may be introduced. The interface stabilization substance may be introduced in either the first fluid or the second fluid, or as a separate material. It is preferable to introduce the interface stabilization substance in the second fluid. In the droplet-generating microfluidic region, the interface stabilization substance segregates to the interfacial region between the first fluid and the second fluid. The interface stabilization substance may be a surfactant (e.g. cationic, anionic, zwitterionic, or nonionic; preferably nonionic) or may be particles, such as functionalized particles that enhance interfacial stability between the first and second fluids.

In some embodiments, droplets within droplets (i.e. nested droplets) are formed. Multiple droplets may be nested within a single droplet. In some embodiments, multiple droplets within a single droplet are combined to enable the assembly of more complex structures. For example, droplets A and B could be nested inside droplet C. The particles in droplet A could be assembled into an array, then droplets A and B could be combined into a larger droplet AB, and finally, the particles originally in droplet B could be assembled onto the array from droplet A.

The first fluid may contain multiple types of particles with different isoelectric points. After assembly of one of the types of particles, the pH may be adjusted by a second trigger that triggers the same pH-control substance as the first trigger and/or a different pH-control substance, thereby assembling the second type of particles on the first type of particles. A device may be constructed that repeats this process with many types of particles, thereby forming a multilayer shell assembly onto a core assembly.

Figure 6:
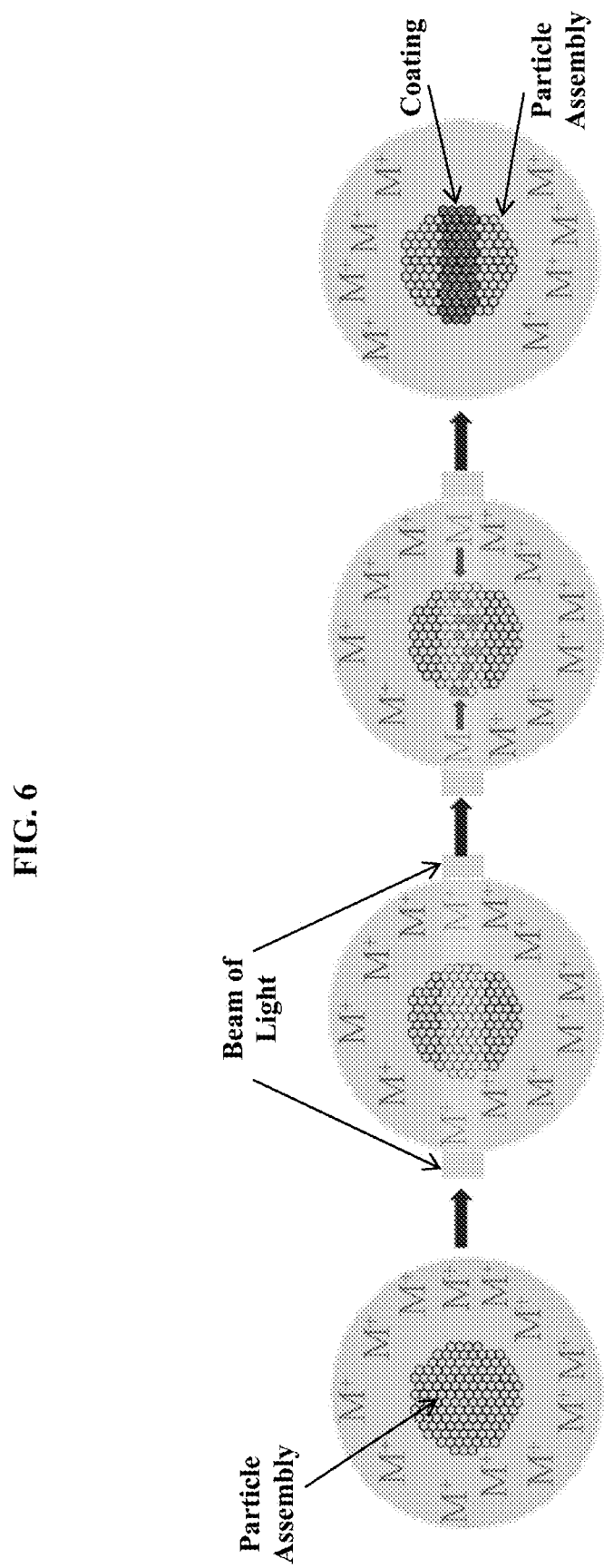
FIG. 6 is a schematic of an optional additional assembly stage using light-induced metal plating to form a metal ring around an assembled particle array.

In some embodiments, a device contains a region for selectively coating an assembled array of particles. The selective coating may occur via patterned light-induced plating, for example. FIG. 6 is a schematic of an optional additional assembly stage using light-induced metal plating to form a metal ring around an assembled particle array. In this approach, metal ions ($M^+$ in FIG. 6) of one or more substances plate onto the surface of the particle. Light patterns with features below the size of the particle illuminate the particle as it flows through the reaction microfluidic region. Preferably, the light pattern is generated with optical interference. Also preferably, the light pattern is constant for a region of space greater than the diameter of a droplet in the microfluidic flow direction.

In some related embodiments, a selective coating may be obtained by using light to selectively remobilize particles that then assemble onto a previously assembled array. In this approach, a first type of particle may be assembled as described above. The array of assembled first type of particles and unassembled second type of particles may be immobilized in the droplet, such as by forming a gel from the dispersed phase. Selected regions of the gel may be turned back into a fluid, such as with light. Light patterns with features below the size of the particle may illuminate the particle as it flows through the reaction microfluidic region. Preferably, the light pattern is generated with optical interference. Also preferably, the light pattern is constant for a region of space greater than the diameter of a droplet in the microfluidic flow direction. A pH-control substance may be activated by a trigger and the remobilized second type of particles may assemble on the array of first type of particles.

Figure 7:
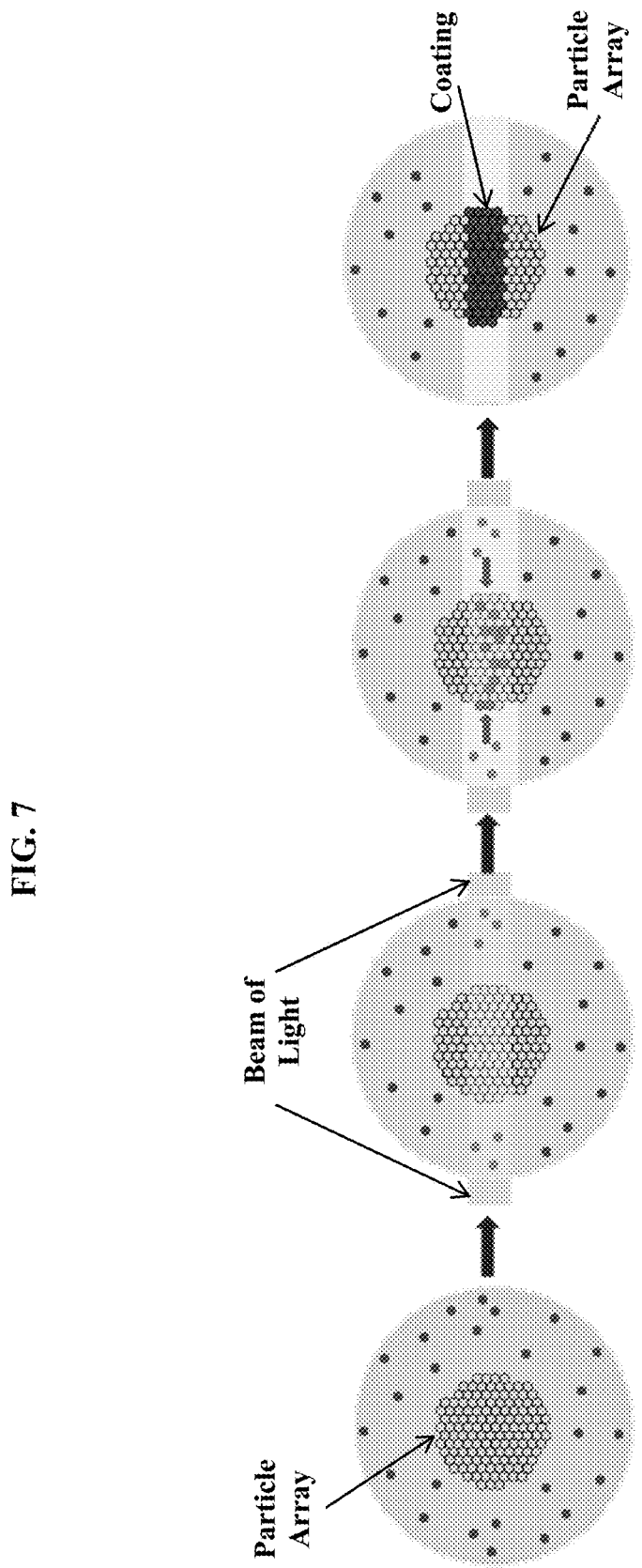
FIG. 7 is a schematic of an optional additional assembly stage using light to selectively depolymerize a gel and free a second set of particles to assemble onto an assembled array of a first set of particles.

FIG. 7 is a schematic of an optional additional assembly stage using light to selectively depolymerize a gel and free a second set of particles to assemble onto an assembled array of a first set of particles.

In some embodiments, assembled arrays are harvested from the dispersed phase after assembly. This harvesting may be done with centrifugation, filtration, evaporation of the solution, or another effective type of separation. Optionally, the dispersed phase is recombined into a continuous phase. The array of assembled nanoparticles is optionally dried to remove any residual solution. The array may then be utilized as a nanoparticle-containing object.

In general, the process of making assembled nanoparticle arrays may be conducted continuously, semi-continuously, or in batch mode. A preferred droplet microfluidic device, such as depicted in FIG. 4A, operates in continuous flow. The flow configuration may be cocurrent, countercurrent, or a hybrid of these.

Some variations of the invention provide a method of using a droplet microfluidic device to form assemblies of particles. One or more of the following steps may be employed.

A first step includes preparing or obtaining a first fluid comprising nanoparticles to be assembled, a solvent, and a pH-control substance. The nanoparticles are dispersed in solution without organic ligands by adjusting the pH to increase the zeta potential above +20 mV or below −20 mV. The nanoparticles may be (already) fully formed or may be a solution of precursors such as metal salts that contain cations or anions that match the composition of the nanoparticles. A salt such as NaCl with no common (with the nanoparticles) cations or anions may be added to change the screening of electrostatic charges in solution. Electrostatic repulsion prevents the particles from agglomerating. Brownian motion, sonication, and/or bulk mixing may be used to keep the particles suspended in solution.

A second fluid is prepared or obtained, wherein the second fluid is substantially immiscible in the first fluid. Both the first and second fluids are flowed into a droplet-generating microfluidic region, thus generating a dispersed phase from the first fluid.

A trigger source is utilized to send a trigger to activate the pH-control substance in a reaction microfluidic region. The solution pH is titrated towards the isoelectric point uniformly in the solution, to induce assembly. Heating or light exposure preferably is stopped when the pH is within 1.5 pH units of the isoelectric point or when the zeta potential of the particles is −10 mV<zeta potential <+10 mV.

The assembled nanoparticles are optionally separated from the solution (e.g., by centrifugation or filtration). The dispersed first fluid may be combined into a continuous phase again. The assembled nanoparticle arrays are optionally dried to remove any residual fluid.

Some variations of the invention provide a device for assembling a plurality of particles into one or more particle arrays, the device comprising:
    (a) a droplet-generating microfluidic region;
    (b) a first-fluid inlet port disposed in fluid communication with the droplet-generating microfluidic region;
    (c) a second-fluid inlet port disposed in fluid communication with the droplet-generating microfluidic region;
    (d) a reaction microfluidic region, disposed in fluid communication with the droplet-generating microfluidic region; and
    (e) a trigger source, disposed in at least one of thermal, optical, mechanical, electromechanical, electrical, acoustic, or magnetic communication with at least a portion of the reaction microfluidic region, wherein the trigger source is configured to trigger generation of an acid or a base from a pH-control substance within the reaction microfluidic region.

In some embodiments, the droplet-generating microfluidic region contains a first fluid and a second fluid; wherein the first fluid contains a plurality of particles, a solvent, and the pH-control substance; and wherein the second fluid is substantially immiscible in the first fluid. The particles may be characterized by an average particle size from about 1 nanometer to about 100 microns. The particles may contain a core and a shell, wherein the core comprises a metal, a ceramic, or a combination thereof, and wherein the shell comprises an oxide, a fluoride, a sulfide, or a combination thereof. The solvent may include one or more compounds selected from the group consisting of water, dimethyl formamide, dimethylsulfoxide, isopropanol, acetone, tetrahydrofuran, and combinations thereof.

In some embodiments, the pH-control substance is triggered with electromagnetic radiation to generate the acid or the base. The pH-control substance, or at least one of the pH-control substances (when more than one is present), may be a photoacid generator or a photobase generator. In these or other embodiments, the pH-control substance, or at least one of the pH-control substances (when more than one is present), is triggered with a change in temperature to generate the acid or the base.

In some devices, the trigger source is configured to uniformly trigger the pH-control substance in space within the reaction microfluidic region. Alternatively, the trigger source may be configured to trigger the pH-control substance in a spatial pattern within the reaction microfluidic region.

Optionally, the trigger source is disposed in electrical communication with a controller to maintain pH within the reaction microfluidic region within a preselected pH range. In some embodiments, the trigger source is disposed in electrical communication with a controller to oscillate pH within the reaction microfluidic region. Optionally, the trigger source is disposed in electrical communication with a controller to maintain pH rate of change within the reaction microfluidic region below a preselected maximum pH rate of change.

In some embodiments, a pH indicator is added to the droplet suspension so that pH changes may be conveniently tracked by monitoring the color in the reaction microfluidic region.

During device operation or following some period of operation, the reaction microfluidic region contains one or more particle arrays. Optionally, the device further comprises a particle-array outlet port disposed in fluid communication with the reaction microfluidic region. The device may be configured for continuous operation. An outlet port may allow for continuous removal of particle arrays, or intermittent removal (recovery) of the particle arrays, out of the device or into an intermediate container. In some embodiments, the device further comprising an additional reaction microfluidic region disposed in fluid communication with the reaction microfluidic region.

FIG. 3 is an exemplary flowchart of various methods of use. Some variations provide a method of using the device, the method comprising:

preparing or obtaining a first fluid comprising a plurality of particles to be assembled, a solvent, and the pH-control substance;

preparing or obtaining a second fluid that is substantially immiscible in the first fluid;

flowing the first fluid through the first-fluid inlet port, into the droplet-generating microfluidic region;

flowing the second fluid through the second-fluid inlet port, into the droplet-generating microfluidic region, thereby generating a plurality of droplets containing the first fluid, wherein the droplets are phase-separated from the second fluid;

flowing the droplets into the reaction microfluidic region;

triggering generation of an acid or a base from the pH-control substance, within the reaction microfluidic region; and titrating pH within the reaction microfluidic region towards the average isoelectric point of the particles.

In some embodiments, the first and second fluids are flowed simultaneously into the droplet-generating microfluidic region.

By titrating the pH within the reaction microfluidic region towards the average isoelectric point of the particles, the particles assemble into a particle array which may be recovered from the reaction microfluidic region. In some embodiments, the titrated pH is within 1.5 pH units, 1.0 units, or 0.5 units of the average isoelectric point of the particles being assembled. The particles may be characterized by an average particle size from about 1 nanometer to about 100 microns.

The overall thickness of the final, assembled structure or object may be from about 10 nm to about 1 cm or more, such as about 50 nm, 100 nm, 250 nm, 500 nm, 750 nm, 1 µm, 10 µm, 20 µm, 25 µm, 30 µm, 40 µm, 50 µm, 75 µm, 100 µm, 500 µm, 1 mm, or larger.

In some embodiments, a repeating, self-similar structure allows the nanoparticle array to be abraded during use while retaining its properties. Should the surface be modified due to environmental events or influences, the self-similar nature of the nanoparticle array allows the freshly exposed surface to present a layer of nanoparticles identical to those which were removed.

Some variations of the present disclosure specifically relate to nanorods. By "nanorod" is meant a rod-shaped particle or domain with a diameter of less than 100 nanometers. Nanorods are nanostructures shaped like long sticks or dowels with a diameter in the nanoscale but a length that is longer or possibly much longer (like needles). Nanorods may also be referred to as nanopillars, nanorod arrays, or nanopillar arrays.

The average diameter of the nanorods may be selected from about 0.5 nanometers to about 100 nanometers, such as from about 1 nanometer to about 60 nanometers. In some embodiments, the nanorods have an average diameter of about 60 nanometers or less. The average axis length of the nanorods may be selected from about 1 nanometer to about 1000 nanometers, such as from about 5 nanometers to about 500 nanometers. When the aspect ratio is large, the length may be in the micron scale.

The nanorod length-to-width ratio is equal to the aspect ratio, which is the axial length divided by the diameter. Nanorods need not be perfect cylinders, i.e. the axis is not necessarily straight and the diameter is not necessarily a perfect circle. In the case of geometrically imperfect cylinders (i.e. not exactly a straight axis or a round diameter), the aspect ratio is the actual axial length, along its line of curvature, divided by the effective diameter, which is the diameter of a circle having the same area as the average cross-sectional area of the actual nanorod shape.

The nanorods may be core-shell structures wherein the shell is a coating that forms a matrix around the nanorods, protects the nanorods from environmental degradation (e.g. oxidation), and will maintain the nanorod shape and array order if the nanorods are chemically transformed to a different material, such as a metal. The shell protects the nanorods and enables chemically transforming the core into a second material that could not be formed directly. The coating surrounding the nanorods is typically different from the majority of the nanorod material. The arrays are preferably free of organic ligands, which limit thermal processing temperatures and are susceptible to environmental degradation.

In some embodiments, the structure contains at least 2 layers, such as at least 3, 4, 5, 6, 7, 8, 9, 10 layers or more. Each layer is counted along the long axis of nanorods.

"Aligned nanorods" means that the long axis of the nanorods have a full width at half maximum angular distribution with respect to the array alignment direction of at most ±20°, and more preferably at most ±10°. Preferably, at least some of the nanorods are in alignment in one axial direction. That is, nanorod alignment is preferentially along one dimension defined by the nanorod axis of length (which may be the average long axis direction defined by all nanorods collectively). Aligned nanorods may be parallel to each other in one or two dimensions.

In some embodiments, the nanorods in each layer of the inorganic structure are characterized by a full width at half maximum angular distribution of the axial direction of about ±20° or less, such as about ±15° or less, about ±10° or less, or about ±5° or less.

In some embodiments, at least 10%, 20%, 30%, 40%, 50%, 60%, 70%, 80%, 90% or more of the nanorods are substantially aligned with each other. By "substantially aligned" it is meant that two nanorods are aligned within 5% of each other, measured by the angle between long axes of the two nanorods.

In some embodiments, at least 10%, 20%, 30%, 40%, 50%, 60%, 70%, 80%, 90% or more of the nanorods are completely aligned with each other. By "completely aligned" it is meant that two nanorods are aligned within 1% of each other, measured by the angle between long axes of the two nanorods. "Perfectly aligned" nanorods, in principle, are aligned with each other, within measurement error of the angle between the two long axes.

Another measure of nanorod alignment is the standard deviation of nanorod long axis angle from the average long axis direction defined by all nanorods collectively. In the theoretical case of perfect alignment of many nanorods, the standard deviation is zero. In some embodiments, the standard deviation of nanorod long axis angle from the average long axis direction defined by all nanorods collectively is about, or less than about, 25%, 20%, 15%, 10%, 5%, 4%, 3%, 2%, 1%, 0.5%, or 0.1%.

The nanorods in some embodiments are cylindrical or ellipsoidal structures with an average length-to-width ratio of about 1.5 or higher, such as about 1.6, 1.7, 1.8, 1.9, 2.0, 2.1, 2.2, 2.3, 2.4, 2.5, 2.6, 2.7, 2.8, 2.9, 3.0, 4.0, 5.0, or higher. The nanorods are not necessarily cylindrical or ellipsoidal; other geometries are possible. Typically the nanorods will be rod-like structures with a length-to-width ratio greater than 1.5, but it should be recognized that other geometries (such as spheres or structures with a length-to-width ratio of less than 1.5) may be present as well, due to impurities, processing defects, or other reasons. The ends of the nanorods may be flat or may be in the form of semi-spherical caps.

The nanorods are packed together and touching or near touching in an array. The nanorods are preferably characterized by an average center-to-center distance between adjacent (packed) nanorods of about twice the average nanorod width, or less, such as about 2, 1.9, 1.8, 1.7, 1.6, 1.5, 1.4, 1.3, 1.2, 1.1, or 1.0 times the average nanorod width. Preferably, the center-to-center distance between nanorods is less than the width of 1.5 nanorods.

When coated nanorods are provided, the average weight ratio of the coating material to the nanorod may be between about 0.01 to about 1 or higher. In certain embodiments, the average weight ratio of the coating material to the nanorod is between about 0.05 to about 0.5, such as about 0.1, 0.2, 0.3, 0.4, or 0.5. Very thin coatings are possible (e.g., weight ratio of about 0.1, 0.05, 0.01 or less), while in other embodiments, the coating forms a continuous phase surrounding the nanorods (e.g., weight ratio of about 0.5, 1, 1.5, 2 or higher).

The nanorods may be anisotropic. As meant herein, "anisotropic" nanorods have at least one chemical or physical property that is directionally dependent. When measured along different axes, an anisotropic nanorod will have some variation in a measurable property. The property may be physical (e.g., geometrical) or chemical in nature, or both. The property that varies along multiple axes may simply be the presence of mass; for example, a perfect sphere would be geometrically isotropic while a cylinder is geometrically anisotropic. A chemically anisotropic nanorod may vary in composition from the surface to the bulk phase, such as via a chemically modified surface or a coating deposited on the nanorod surface. The amount of variation of a chemical or physical property may be 5%, 10%, 20%, 30%, 40%, 50%, 75%, 100% or more.

In some embodiments of the invention, the nanorods and the coating material form core-shell substructures. In these or other embodiments, the coating material may form a continuous phase surrounding the nanorods.

The structure may be present in a device, material, or system selected from the group consisting of magnets, optical devices, coatings, electronic devices, electrochemical systems, and computers.

Some embodiments provide a magnetic nanocomposite that includes a magnetic material with a high energy product made from low-cost aligned metal nanorods. Aligned, small-diameter rods of iron or iron-cobalt alloys are advantageous because the shape and the alignment each enhance the hardness or coercivity, which in turn increases the energy density of a magnet made from these magnetic nanocomposites. Furthermore, the nanorods disclosed herein preferably do not contain expensive rare-earth elements (such as neodymium or dysprosium) or precious metals (such as platinum).

Magnetic nanocomposites can provide the performance of higher-cost, rare earth element-based magnets at lower cost and mass by structuring low-cost metals instead of using rare earths, which can have significant cost and supply fluctuations. Magnetic nanocomposites can also provide equal or better performance compared to existing nanorod-based magnets at lower mass, due to a lower-density non-metallic matrix employed in the magnetic nanocomposites herein.

Magnetic induction B (also known as magnetic flux density) has the unit tesla T (Wb/m$^2$). The gauss, abbreviated as G or Gs, is the cgs unit of measurement of a magnetic field B. One tesla is equal to $10^4$ gauss. A magnetizing field, H, is measured in amperes per meter. The magnetic flux density, B, and the magnetic field strength, H, are related by the magnetic permeability $\mu$, according to B=$\mu$H. The permeability $\mu$ is the measure of the ability of a material to support the formation of a magnetic field within itself. Permeability is the degree of magnetization that a material obtains in response to an applied magnetic field. The auxiliary magnetic field H represents how a magnetic field B influences the organization of magnetic dipoles in a given medium, including dipole migration and magnetic dipole reorientation.

The coercivity, also called the magnetic coercivity, coercive field, or coercive force, is a measure of the ability of a ferromagnetic material to withstand an external magnetic field without becoming demagnetized. For ferromagnetic materials, the coercivity is the intensity of the applied magnetic field required to reduce the magnetization of that material to zero after the magnetization of the sample has been driven to saturation. Coercivity is usually measured in Oersted (Oe) or ampere/meter and may be denoted $H_C$. Coercivity can be measured using a B-H analyzer or magnetometer. Ferromagnetic materials with high coercivity are called magnetically hard materials.

Energy product, $(BH)_{max}$, is the volumetric energy density of a magnet. A motor with higher $(BH)_{max}$ magnets will have more power than one with similar sized magnets with lower energy products. $(BH)_{max}$ is defined the peak energy that a magnet can deliver when operating at a working point on the demagnetization curve and may be measured in Mega-Gauss-Oersteds (MG·Oe). To obtain the highest possible energy product, a magnet must have a high coercivity or hardness as well as a high magnetic moment per atom.

Rod-shaped domains may be made from iron or alloys of iron-cobalt, iron-nitrogen, or iron-gallium. This is advantageous because iron and cobalt have very high magnetic moments per atom, thereby increasing the energy product $(BH)_{max}$. Furthermore, iron and cobalt have high Curie temperatures of 770° C. and 1130° C., respectively, which allows magnets made of these materials to operate at and retain their energy product to higher temperatures compared to existing NdFeB-based magnets. NdFeB (neodymium-iron-boron) has a Curie temperature of 350° C. and NdFeB with added Dy (dysprosium) has a maximum operating temperature of 80° C. with 6% Dy and 200° C. with 12% Dy.

The rod-shaped domains are preferably aligned in the array. This alignment results in a higher remnant magnetization which results in increased coercivity and increased energy product $(BH)_{max}$. Furthermore, the rigidity of the array is preferably maintained up to 500° C. which keeps the magnets from deforming when used at elevated temperatures. This allows the magnets to be used in high-temperature electric motors and not require the motors to be air-cooled or liquid-cooled.

The nanorods may contain one or more materials selected from the group consisting of iron, iron-cobalt alloys, iron-nickel alloys, iron-gallium alloys; oxides, oxyhydroxides, nitrides, sulfides, or carbides thereof; and combinations of any of the foregoing materials. The nanorods are preferably also essentially free of rare-earth elements, such as samarium, neodymium, or dysprosium. Trivial amounts of rare-earth elements may be present due to impurities. In some embodiments, the nanorods are also essentially free of precious metals, such as platinum, gold, or rhodium.

EXAMPLES

Example 1: Iron Oxide Nanorods

In this example, β-FeOOH nanorods are fabricated for later assembly.

The synthesis of β-FeOOH nanorods occurs by mixing 270 mg of $FeCl_3.6H_2O$ and 16 mL of water. The resulting transparent orange solution is then sealed in a Teflon-lined 23 mL acid digestion bomb that is subsequently warmed up at a rate of 1.0° C./min to 120° C. and held for 1 hour in an oven. The reaction bomb is allowed to naturally cool down to room temperature after 1 hour and the resulting brown precipitate is collected with centrifugation. The solids are suspended in water, vortexed, and centrifuged; the supernatant is discarded. This cleaning step is repeated two additional times.

Figure 8:
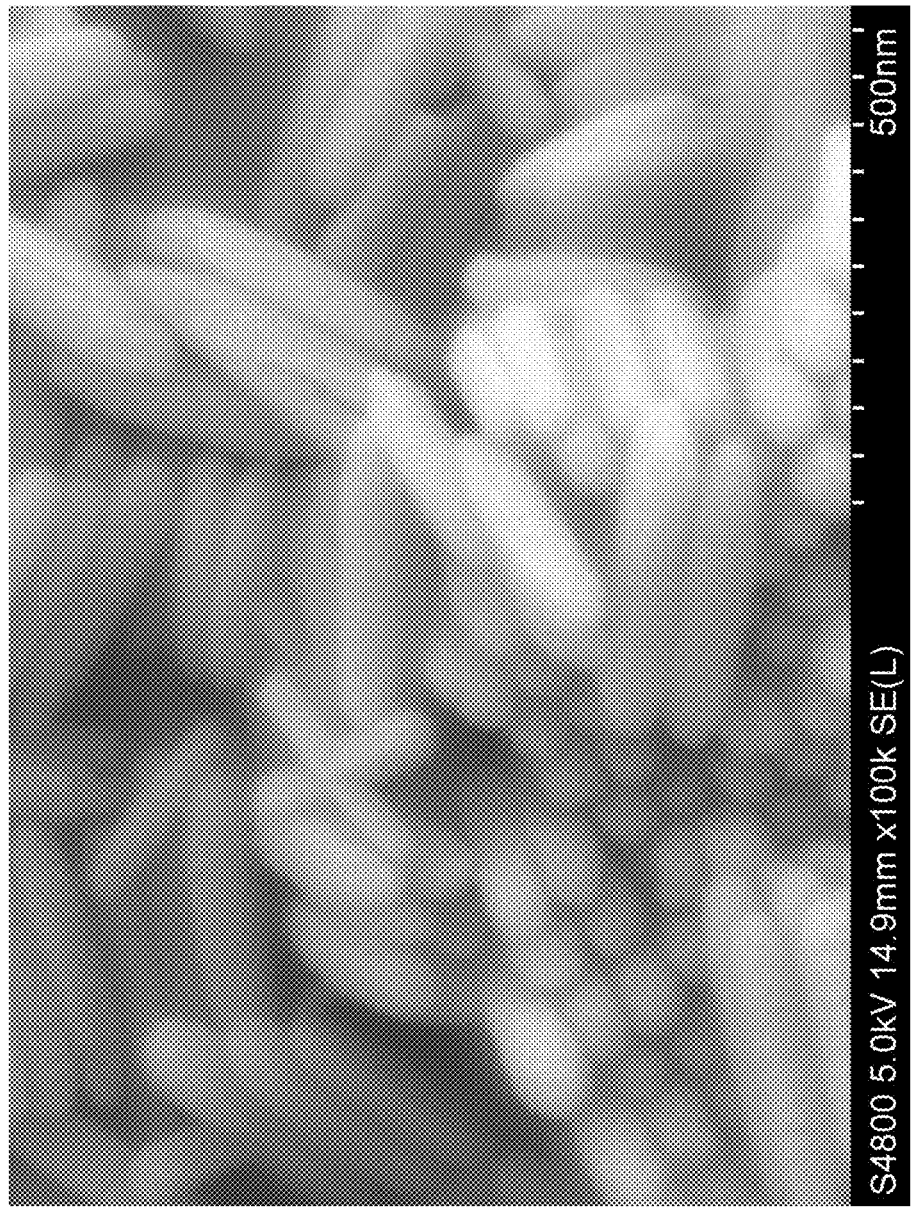
FIG. 8 shows a SEM image of β-FeOOH nanorods, in Example 1.

The material has an isoelectric point of 5.95. The iron oxide nanorods are shown in an SEM image, in FIG. 8.

Example 2: Al-Containing Iron Oxide Nanorods

This example describes generation of aluminum-containing iron oxide nanorods for later assembly of the nanorods.

The synthesis of Al-containing β-FeOOH nanorods occurs by mixing 270 mg of $FeCl_3.6H_2O$, 120 mg urea, 43 mg of $Al(NO_3)_3.9H_2O$, and 16 mL of water. The resulting transparent orange solution is then sealed in a Teflon-lined 23 mL acid digestion bomb that is subsequently warmed up at a rate of 1.0° C./min to 120° C. and held for 2 hours in an oven. The reaction bomb is then allowed to naturally cool down to room temperature and the resulting brown precipitate is collected with centrifugation. The solids are suspended in water, vortexed, and centrifuged; the supernatant is discarded. This cleaning step is repeated two additional times.

Figure 9:
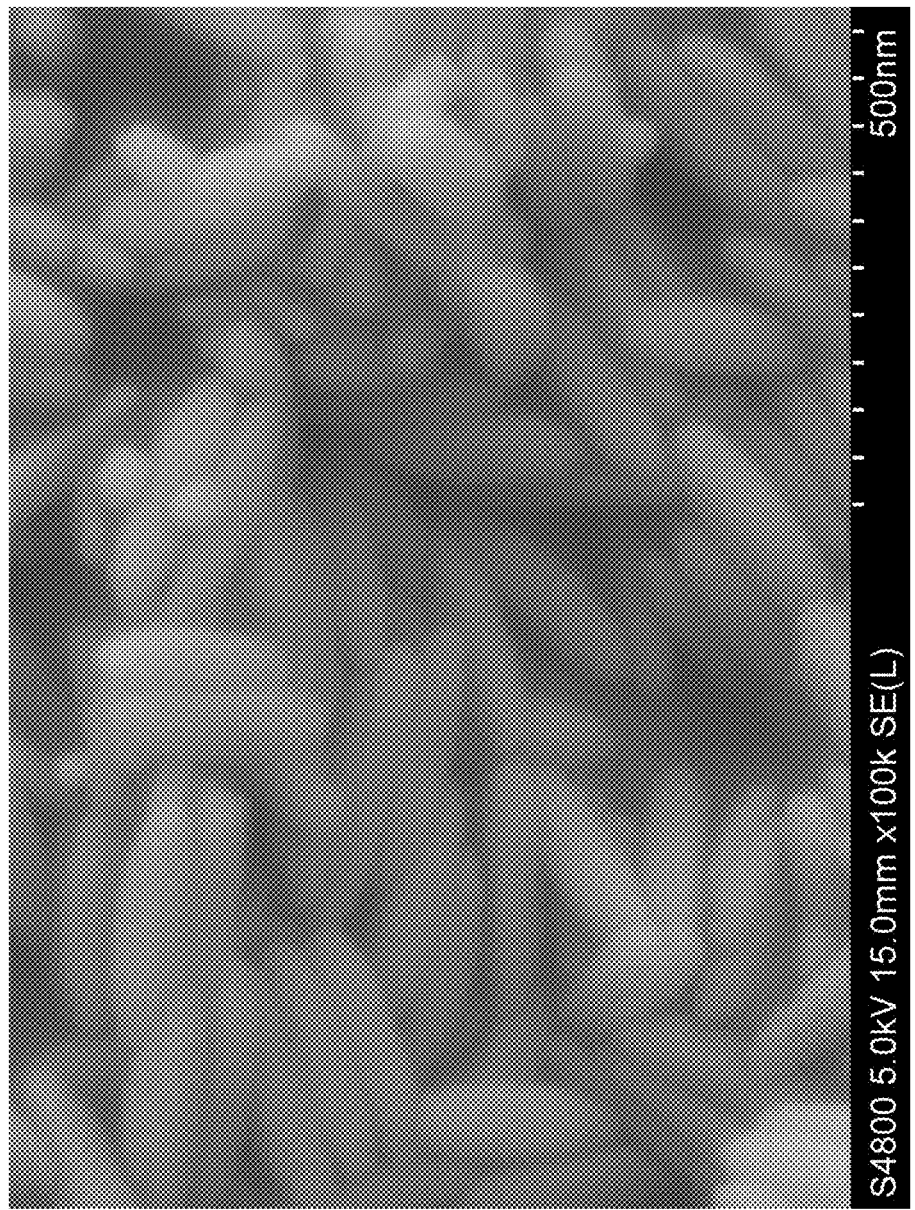
FIG. 9 shows a SEM image of Al-containing β-FeOOH nanorods, in Example 2.

The material has an isoelectric point of 7.50 showing that Al is present in the iron oxide (aluminum oxides have higher isoelectric points than iron oxides). The Al-containing β-FeOOH nanorods are shown in a SEM image, FIG. 9.

Example 3: Assembly of Iron Oxide Nanorods

In this example, the β-FeOOH nanorods fabricated in Example 1 are assembled into nanorod arrays.

The product from Example 1 is dispersed in 16 mL of deionized water. 8 mL of the material is separated and the pH is adjusted to 1.6 with 0.5 M HCl. 19 mg urea is added. The resulting suspension is then sealed in a Teflon-lined 23 mL acid digestion bomb that is subsequently warmed up at a rate of 1.0° C./min to 120° C. and held for 1 hour in an oven. The reaction bomb is allowed to naturally cool down to room temperature.

The final pH is 6.70. The orange precipitate is collected with centrifugation. The solids are suspended in water, vortexed, and centrifuged; the supernatant is discarded. This cleaning step is repeated two additional times.

Figure 10:
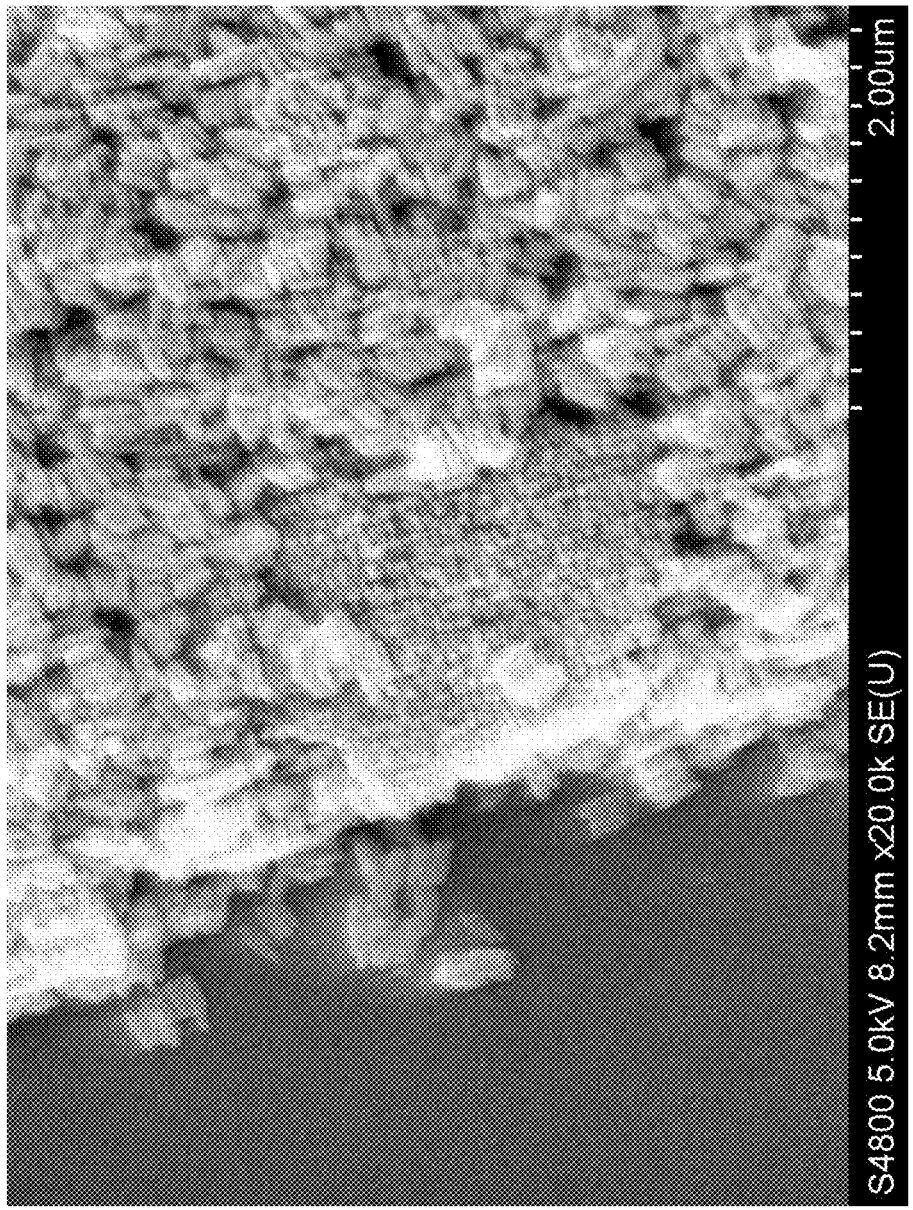
FIG. 10 shows a SEM image of assembled β-FeOOH nanorods, in Example 3.

The assembled product is shown in a SEM image, in FIG. 10.

Example 4: Assembly of Iron Oxide Nanorods from a Higher Starting pH

In this example, the β-FeOOH nanorods fabricated in Example 1 are assembled into nanorod arrays, using a higher starting solution pH versus Example 3.

The product from Example 1 is dispersed in 16 mL of deionized water. 8 mL of the material is separated and the pH is adjusted to 2.6 with 0.1 M HCl. 2 mg urea is added. The resulting suspension is then sealed in a Teflon-lined 23 mL acid digestion bomb that is subsequently warmed up at a rate of 1.0° C./min to 120° C. and held for 2 hour in an oven. The reaction bomb is then allowed to naturally cool down to room temperature.

The final pH is 6.70. The brown precipitate is collected with centrifugation. Then the solids are suspended in water, vortexed, and centrifuged; the supernatant is discarded. This cleaning step is repeated two additional times.

Figure 11:
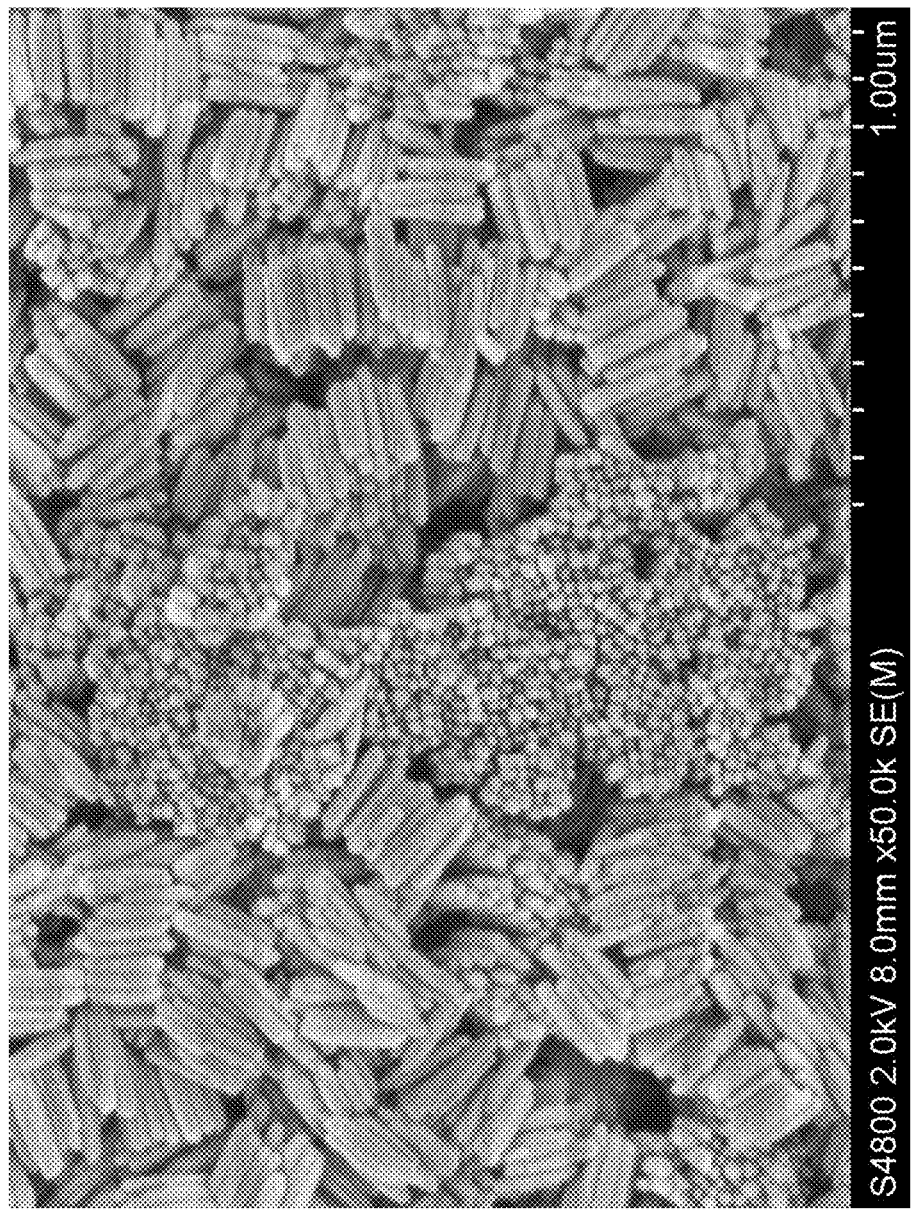
FIG. 11 shows a SEM image of assembled β-FeOOH nanorods, in Example 4.

The assembled product is shown in a SEM image, in FIG. 11.

Example 5: Assembly of Al-Containing Iron Oxide Nanorods

In this example, the β-FeOOH nanorods fabricated in Example 2 are assembled into nanorod arrays.

The product from Example 2 is dispersed in 16 mL of deionized water. 8 mL of the material is separated and the pH is adjusted to 1.7 with 0.5 M HCl, and 19 mg urea is added. The resulting suspension is then sealed in a Teflon-lined 23 mL acid digestion bomb that is subsequently warmed up at a rate of 1.0° C./min to 120° C. and held for 1 hour in an oven. The reaction bomb is allowed to naturally cool down to room temperature.

The final pH is 6.60. The brown precipitate is collected with centrifugation. The solids are suspended in water, vortexed, and centrifuged; the supernatant is discarded. This cleaning step is repeated two additional times.

Figure 12:
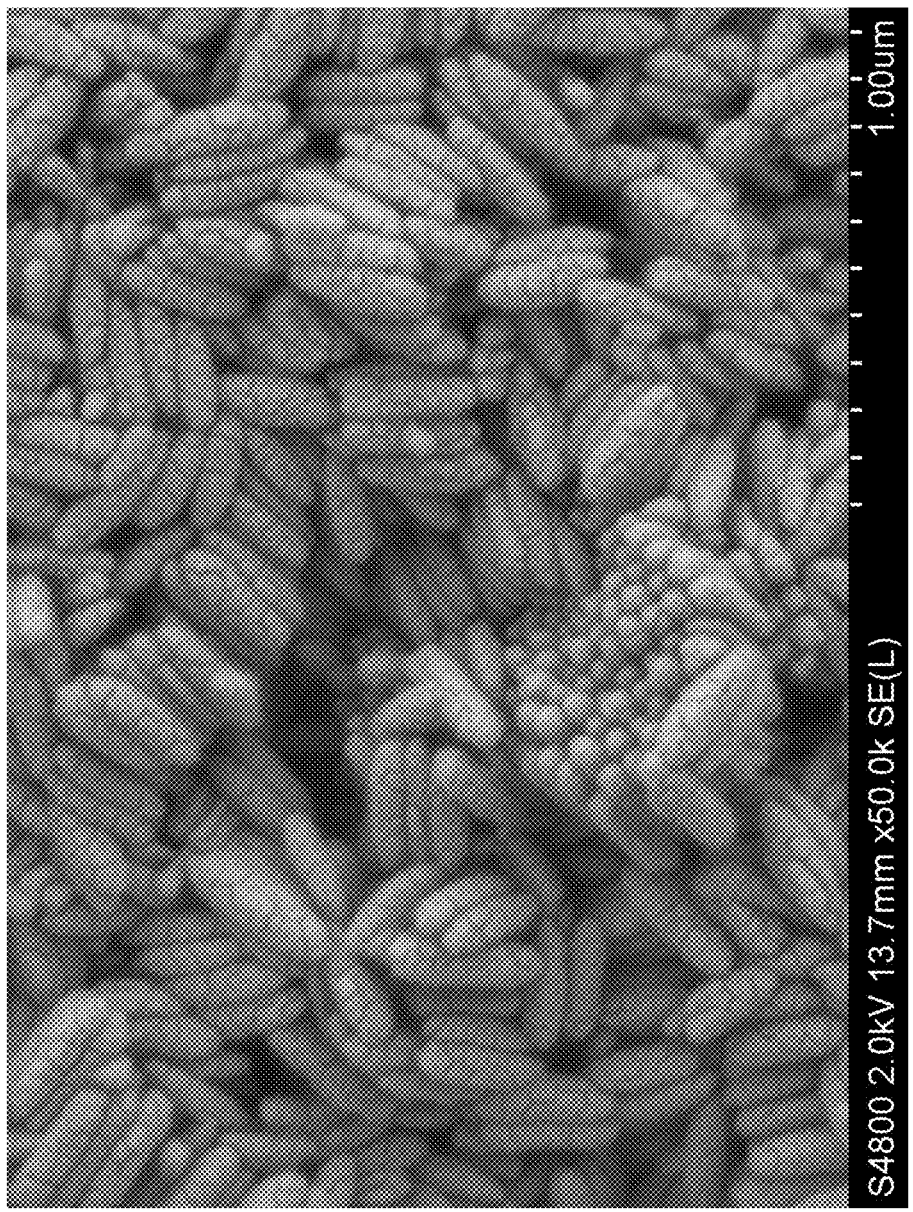
FIG. 12 shows a SEM image of assembled Al-containing β-FeOOH nanorods, in Example 5.

The assembled product is shown in a SEM image, in FIG. 12.

Example 6: Assembly of Al-Containing Iron Oxide Nanorods from a Higher Starting pH In this example, the β-FeOOH nanorods fabricated in Example 2 are assembled into nanorod arrays, using a higher starting solution pH versus Example 5.

The product from Example 2 is dispersed in 16 mL of deionized water. 8 mL of the material is separated and the pH is adjusted to 2.6 with 0.1 M HCl, and 2 mg urea is added. The resulting suspension is then sealed in a Teflon-lined 23 mL acid digestion bomb that is subsequently warmed up at a rate of 1.0° C./min to 120° C. and held for 2 hour in an oven. The reaction bomb is allowed to naturally cool down to room temperature.

The final pH is 6.55. The brown precipitate is collected with centrifugation. The solids are suspended in water, vortexed, and centrifuged; the supernatant is discarded. This cleaning step is repeated two additional times.

Figure 13:
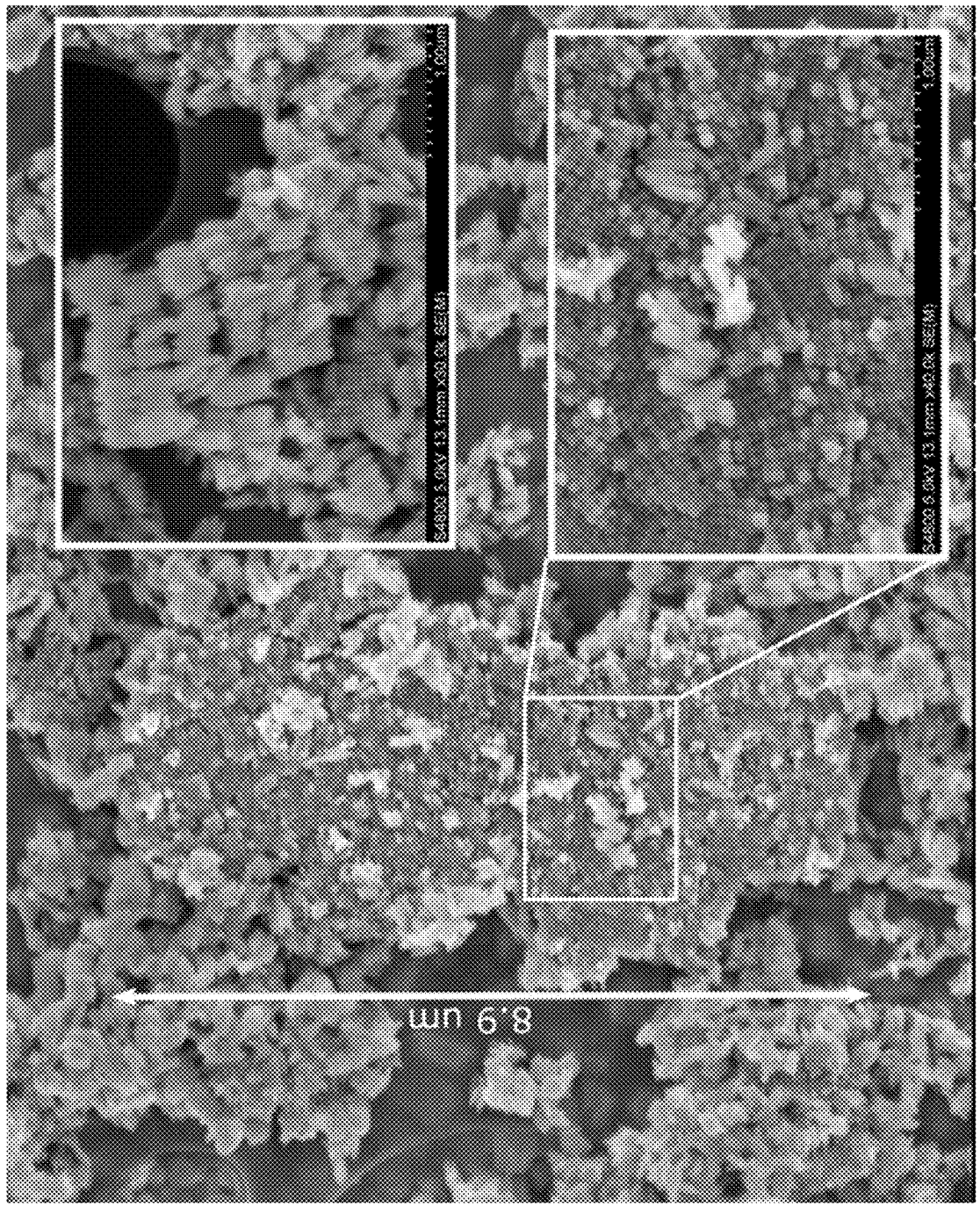
FIG. 13 shows a SEM image of assembled Al-containing β-FeOOH nanorods, in Example 6.

The assembled product is shown in a SEM image, in FIG. 13, including a zoomed-in portion.

Comparative Example A: Assembly of Example 1 Nanorods to a pH Greater Than 2.0 pH Units Away from Isoelectric Point of the Nanorods.

The product from Example 1 is dispersed in 16 mL of deionized water. 8 mL of the material is separated and the pH is adjusted to 1.6 with 0.5 M HCl, and 19 mg urea was added. The resulting suspension is then sealed in a Teflon-lined 23 mL acid digestion bomb that is subsequently warmed up at a rate of 1.0° C./min to 120° C. and held for 10 hours in an oven. The bomb is allowed to naturally cool down to room temperature.

The final pH is 8.54, which is about 2.6 pH units higher than the isoelectric point (5.95) of the Example 1 product. The brown precipitate is collected with centrifugation. The solids are suspended in water, vortexed, and centrifuged; the supernatant is discarded. This cleaning step is repeated two additional times.

Figure 14:
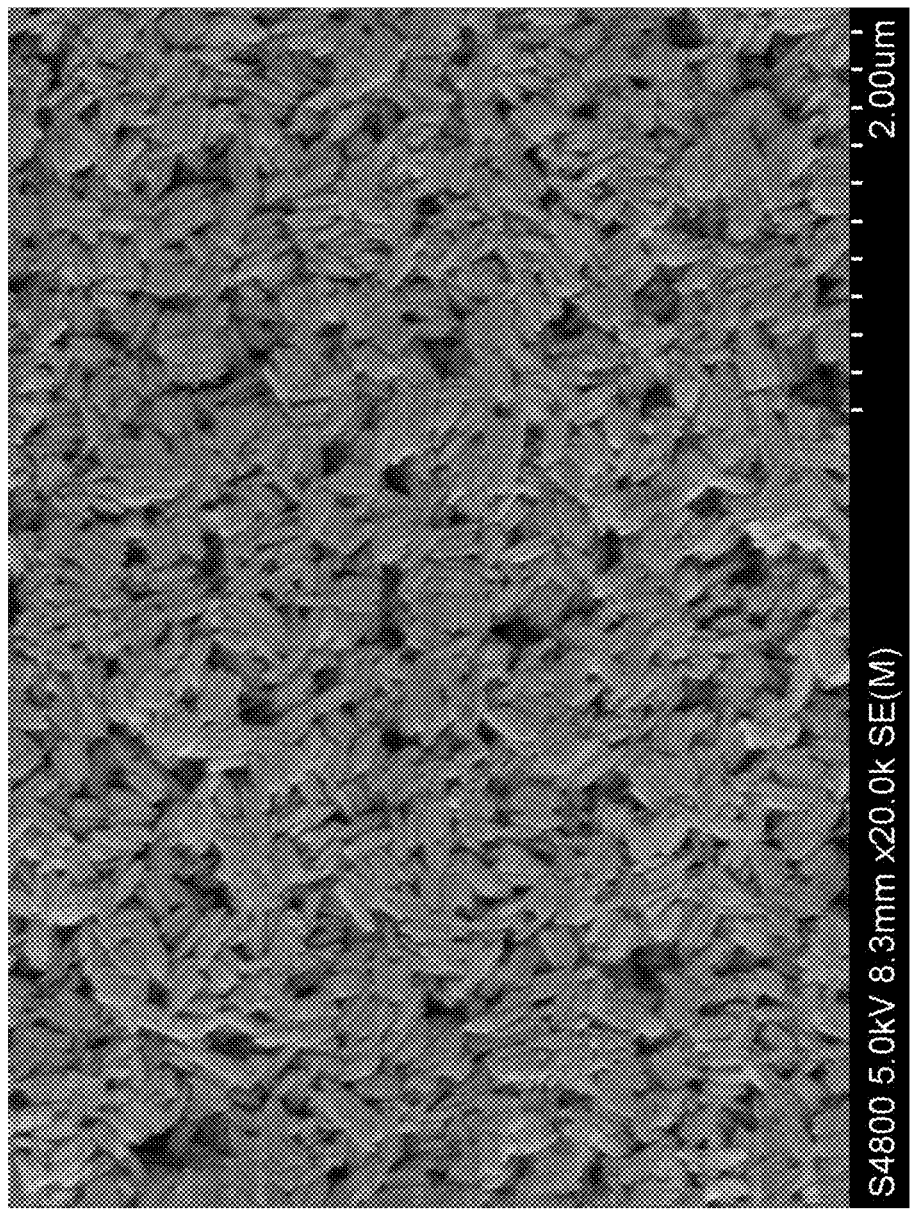
FIG. 14 shows a SEM image of disordered β-FeOOH nanorods, in Comparative Example A.

The product is shown in a SEM image, in FIG. 14. The nanorods are disordered.

Figure 15:
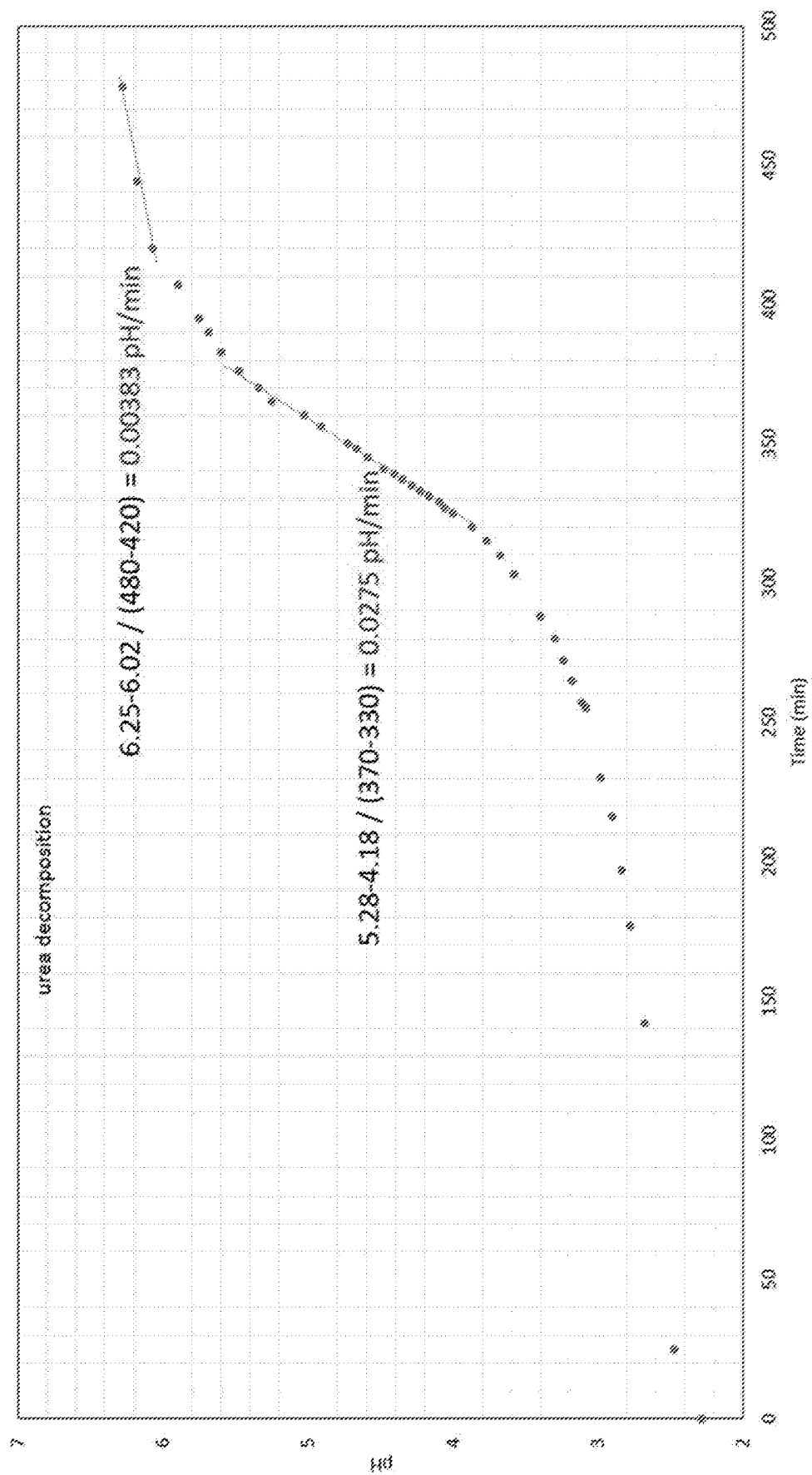
FIG. 15 is a graph of experimental rate of change of pH with time, in Example 7.

Example 7: Assembly of Al-Containing Iron Oxide Nanorods with Optimized Rate of Change of pH This example uses the same experimental set-up as Example 5, in which urea is the triggerable pH-control substance. FIG. 15 shows experimental data depicting the rate of change of pH with time, for urea decomposition. It has been found that large volume assembly is obtained at the end of the curve where the pH is changing slowly at 0.00383 pH units/min. Small assemblies are obtained if the triggering process is stopped around the middle of the curve where the pH is changing at 0.0275 pH units/min.

Figure 16A:
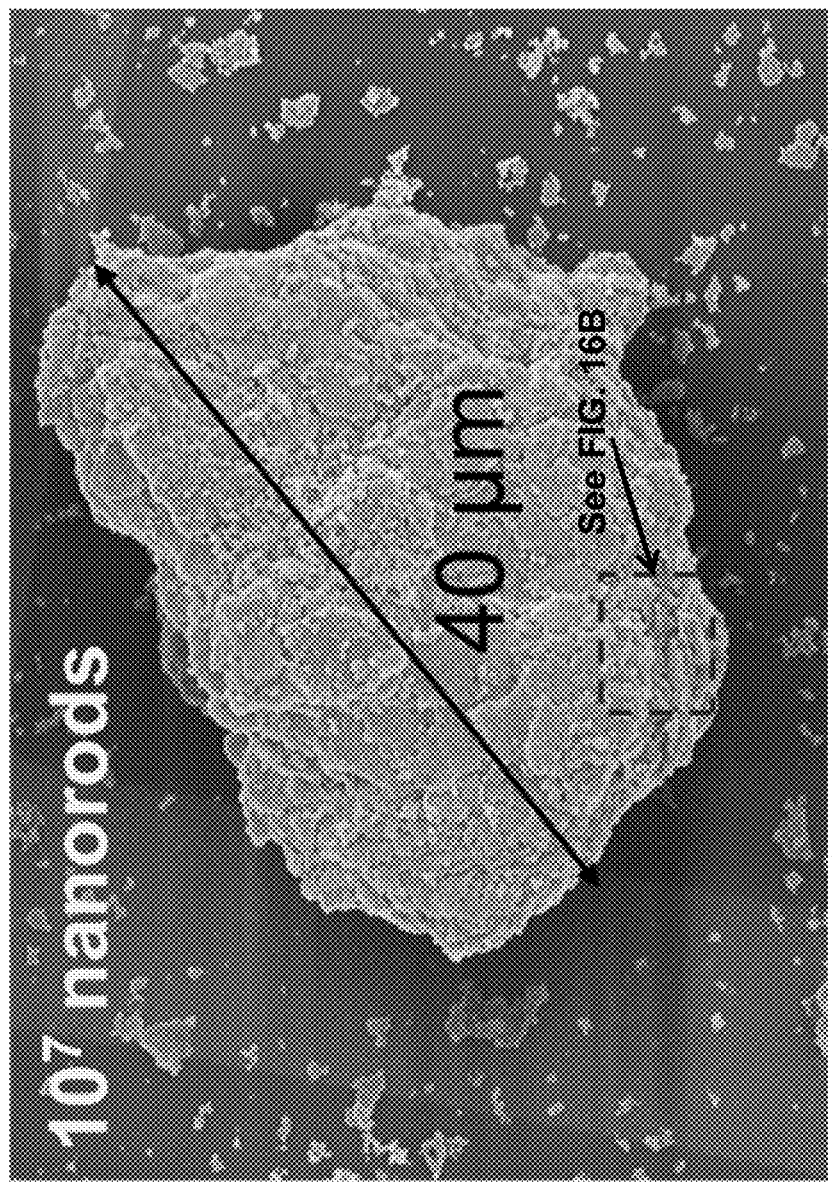
FIG. 16A shows a SEM image of the bulk assembled structure, in Example 7.
Figure 16B:
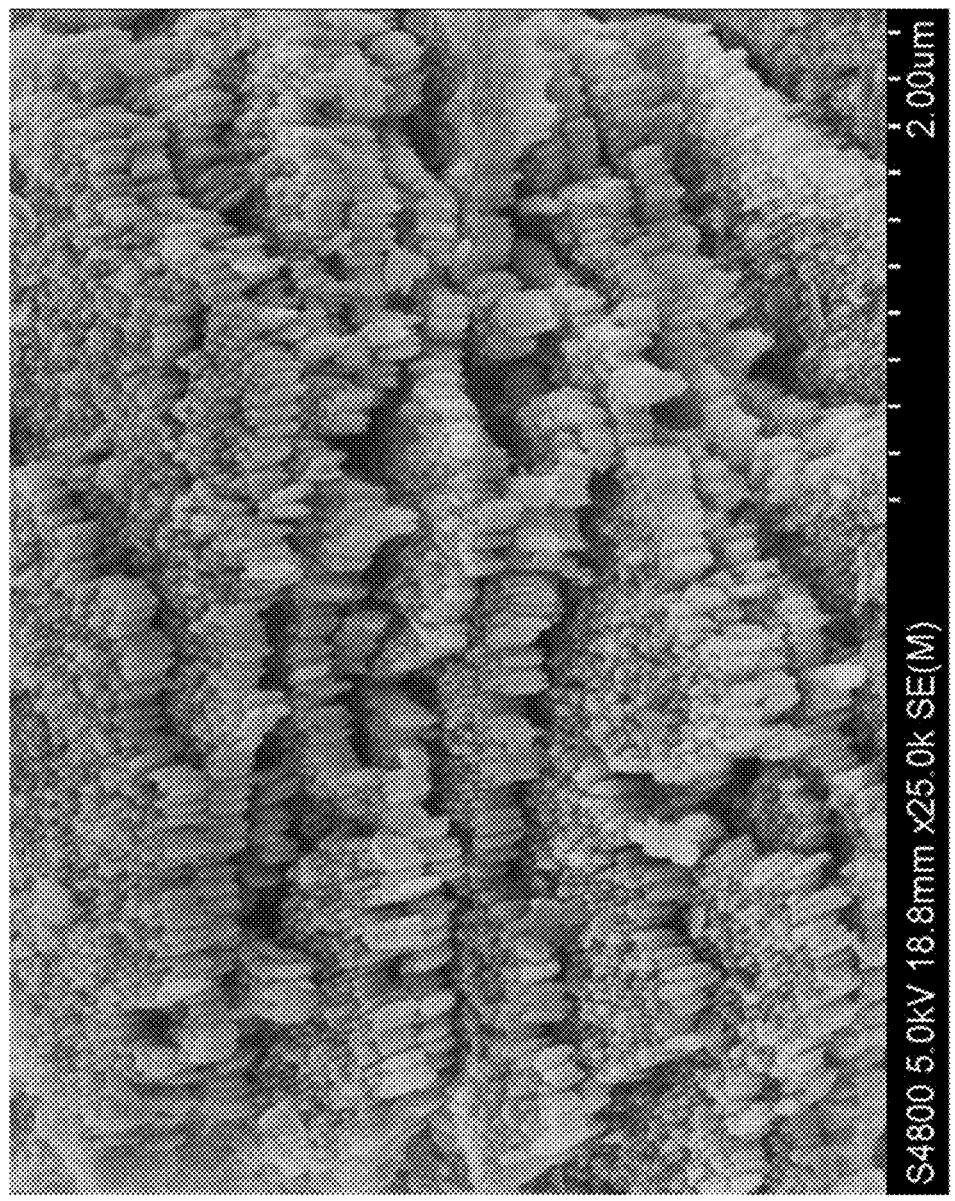
FIG. 16B shows a SEM image of individual nanorods that have assembled, in Example 7.

FIG. 16A shows a SEM image of the bulk assembled structure (about $10^7$ nanorods) and FIG. 16B shows a SEM image of the individual nanorods that have assembled.

This demonstrates that the rate of change should be preferably about 0.01 pH units/min, or less, for better particle assembly. It is believed (without limitation) that the addition of aluminum to iron oxide nanorods increases the isoelectric point to a region in which urea decomposes at a slower rate, giving nanorods more time to assemble.

Example 8: Assembly of Lithium Yttrium Fluoride Nanoprisms

In this example, lithium yttrium fluoride nanoparticles are assembled into arrays.

50 mg of lithium yttrium fluoride ($LiYF_4$) nanoparticles is dispersed in 8 mL of deionized water. The pH is adjusted to 4.5 with 0.1 M HCl and 4 mg urea is added. The resulting suspension is then sealed in a Teflon-lined 23 mL acid digestion bomb that is subsequently warmed up at a rate of 1.0° C./min to 120° C. and held for 2 hours in an oven. The bomb is allowed to naturally and slowly cool down to room temperature.

The final pH is 8.9. The white precipitate is collected with centrifugation. The solids are suspended in water, vortexed, and centrifuged; the supernatant is discarded. This cleaning step is repeated two additional times.

Figure 17:
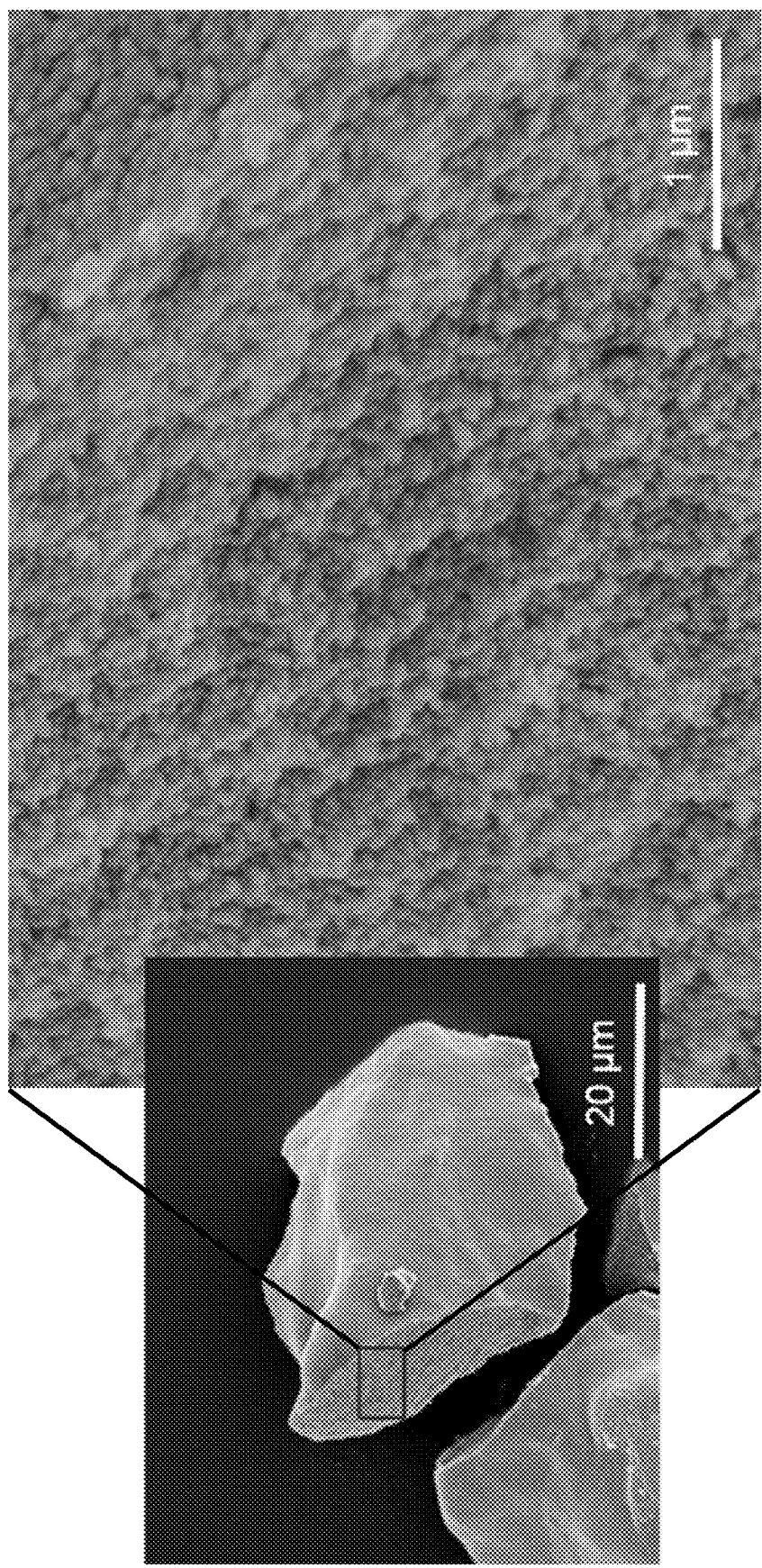
FIG. 17 shows a SEM image of lithium yttrium fluoride nanoparticles assembled into arrays.

The assembled product is shown in a SEM image, in FIG. 17, including a zoomed-in, cracked portion demonstrating high packing density.

These examples collectively demonstrate that the end state of nanoparticle surface charge (and zeta potential) is important. Controlling the final pH, as well as the pH rate of change, is preferred for ex situ assembly of nanoparticles. A slow rate of change near the isoelectric point allows nanoparticles to better orient and pack, for higher final size and packing density.

This disclosure enables bottom-up technology to bridge the nanoscale to the microscale (or even macroscale). The present invention is material-agnostic (without requiring organic ligands), scalable, fast, and economic.

The assembly of magnetic nanoparticles could be useful for such magnetic devices. Furthermore, arrays of nanoparticles are useful altering the wetting and icing on surfaces as well as creating optically scattering or diffractive coatings.

The structures provided herein are useful in a wide variety of applications, including but not limited to drive motors, windshield wiper motors, starter motors, commercial aircraft pumps and actuators, magnets, controlled wetting and anti-reflective coatings, optical scattering surfaces, diffractive coatings, and cameras. Integrated magnetic components can be provided, such as micron-thick magnetic thin films from nanoparticles, which are difficult to achieve with top-down fabrication.

In this detailed description, reference has been made to multiple embodiments and to the accompanying drawings in which are shown by way of illustration specific exemplary embodiments of the invention. These embodiments are described in sufficient detail to enable those skilled in the art to practice the invention, and it is to be understood that modifications to the various disclosed embodiments may be made by a skilled artisan.

Where methods and steps described above indicate certain events occurring in certain order, those of ordinary skill in the art will recognize that the ordering of certain steps may be modified and that such modifications are in accordance with the variations of the invention. Additionally, certain steps may be performed concurrently in a parallel process when possible, as well as performed sequentially.

All publications, patents, and patent applications cited in this specification are herein incorporated by reference in their entirety as if each publication, patent, or patent application were specifically and individually put forth herein.

The embodiments, variations, and figures described above should provide an indication of the utility and versatility of the present invention. Other embodiments that do not provide all of the features and advantages set forth herein may also be utilized, without departing from the spirit and scope of the present invention. Such modifications and variations are considered to be within the scope of the invention defined by the claims.

What is claimed is:

1. An array of particles produced by a process comprising:
dispersing a plurality of first particles in a volume of liquid solution, wherein said first particles are characterized by an average zeta potential, and wherein said liquid solution is characterized by a starting pH;
introducing to said liquid solution before, during, or after said first particles are dispersed in said liquid solution, a triggerable pH-control substance capable of generating an acid or a base when triggered; and
triggering said pH-control substance to generate an acid or a base within said volume of liquid solution, thereby adjusting solution pH from said starting pH to a titrated pH, wherein said average zeta potential is closer to zero at said titrated pH compared to said starting pH, causing said first particles to assemble into a particle array.

2. The array of particles of claim 1, wherein said array of particles is derived from at least one hundred individual particles, and wherein said array of particles is characterized by a packing density of at least 50 vol %.

3. A structure containing an array of particles, wherein said array of particles contains at least one hundred individual particles that are assembled together with a packing density of at least 50 vol %, and wherein said particles are essentially free of organic molecules chemically bonded or physically adsorbed to surfaces of said particles.

4. The structure of claim 3, wherein said particles are characterized by an average particle size from about 5 nanometers to about 1 micron.

* * * * *